United States Patent
Yamazaki et al.

(10) Patent No.: US 6,635,589 B2
(45) Date of Patent: *Oct. 21, 2003

(54) METHODS OF HEAT TREATMENT AND HEAT TREATMENT APPARATUS FOR SILICON OXIDE FILMS

(75) Inventors: Shunpei Yamazaki, Tokyo (JP); Yasuhiko Takemura, Kanagawa (JP); Mitsunori Sakama, Kanagawa (JP); Tomohiko Sato, Kanagawa-ken (JP); Satoshi Teramoto, Kanagawa (JP); Shigefumi Sakai, Kanagawa (JP)

(73) Assignee: Semiconductor Energy Laboratory Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,999

(22) Filed: Apr. 7, 1999

(65) Prior Publication Data

US 2002/0160622 A1 Oct. 31, 2002

Related U.S. Application Data

(62) Division of application No. 08/510,288, filed on Aug. 2, 1995.

(30) Foreign Application Priority Data

| | | | |
|---|---|---|---|
| Aug. 11, 1994 | (JP) | ............................................ | 6-212031 |
| Aug. 11, 1994 | (JP) | ............................................ | 6-212032 |
| Aug. 11, 1994 | (JP) | ............................................ | 6-212033 |

(51) Int. Cl.[7] ............................................. H01L 21/42
(52) U.S. Cl. ...................... 438/798; 438/162; 438/166; 438/791; 438/798; 438/910; 438/958; 427/582; 427/583
(58) Field of Search ................................ 438/162, 795, 438/798, 909, 791, 166, 910, 958; 427/582, 583

(56) References Cited

U.S. PATENT DOCUMENTS 3,798,061 A * 3/1974 Yamazaki .......... 148/DIG. 106

(List continued on next page.)

FOREIGN PATENT DOCUMENTS

EP 0 661 385 A1 7/1995

(List continued on next page.)

OTHER PUBLICATIONS

M. Bhat et al., Extended Abstracts of the 1993 International Conference on Solid State Devices and Materials, Makuhari, 1993, pp. 146–148, "Correlation between Chemical Structure and Electrical Properties of $NH_3$–Nitrided $N_2O$ Oxides", Aug.–Sep. 1993.

(List continued on next page.)

Primary Examiner—Kamand Cuneo
Assistant Examiner—Lisa Kilday
(74) Attorney, Agent, or Firm—Nixon Peabody LLP; Jeffrey L. Costellia

(57) ABSTRACT

Silicon oxide films which are good as gate insulation films are formed by subjecting a silicon oxide film which has been formed on an active layer comprising a silicon film by means of a PVD method or CVD method to a heat treatment at 300–700° C. in a dinitrogen monoxide atmosphere, or in an $NH_3$ or $N_2H_4$ atmosphere, while irradiating with ultraviolet light, reducing the hydrogen and carbon contents in the silicon oxide film and introducing nitrogen into the boundary with the silicon film in particular. Furthermore, silicon oxide films which are good as gate insulating films have been formed by subjecting silicon oxide films which have been formed on an active layer comprising a silicon film by means of a PVD method or CVD method to a heat treatment at 300–700° C. in an $N_2O$ atmosphere (or hydrogen nitride atmosphere) while irradiating with ultraviolet light, and then carrying out a heat treatment at 300–700° C. in a hydrogen nitride atmosphere ($N_2O$ atmosphere), and reducing the amount of hydrogen and carbon in the silicon oxide film and introducing nitrogen into the boundary with the silicon film in particular.

30 Claims, 11 Drawing Sheets

U.S. PATENT DOCUMENTS

| | | | |
|---|---|---|---|
| 4,724,160 A | * 2/1988 | Arvidson et al. | 437/225 |
| 4,735,821 A | * 4/1988 | Yamazaki et al. | 427/582 |
| 4,784,975 A | 11/1988 | Hofmann et al. | 437/247 |
| 5,198,392 A | 3/1993 | Fukuda et al. | 437/241 |
| 5,275,977 A | 1/1994 | Otsubo et al. | |
| 5,681,759 A | * 10/1997 | Zhang | 438/487 |

FOREIGN PATENT DOCUMENTS

| | | | |
|---|---|---|---|
| GB | 2199046 A | * 6/1988 | C23C/16/04 |
| JP | 3-160720 | 7/1991 | |
| JP | 3-268429 | 11/1991 | |
| JP | 5-51749 | 3/1993 | |
| JP | 05-121568 | 5/1993 | |
| JP | 05-218405 | 8/1993 | |
| JP | 06-140392 | 5/1994 | |
| KR | 91-10646 | 6/1991 | |
| KR | 94-10502 | 10/1994 | |

OTHER PUBLICATIONS

A.B. Joshi et al., Extended Abstracts of the 1993 International Conference on Solid State Devices and Materials, Makuhari, 1993, pp. 519–521, "Highly Reliable Oxynitride Gate Dielectrics for Dual Gate CMOS Applications", Aug.–Sep. 1993.

T.S. Chao et al., Extended Abstracts of the 1993 International Conference on Solid State Devices and Materials, Makuhari, 1993, pp.636–638, "Characterization the Interfacial Layer of $N_2O$ Oxide by Using Ellipsometer and FTIR", Aug.–Sep. 1993.

* cited by examiner

METHODS OF HEAT TREATMENT AND HEAT TREATMENT APPARATUS FOR SILICON OXIDE FILMS

This application is a Divisional application of Ser. No. 08/510,288, filed Aug. 2, 1995.

DETAILED DESCRIPTION OF THE INVENTION

FIELD OF THE INVENTION

The inventions concern methods for the manufacture of semiconductor devices, such as thin film transistors (TFT) or thin film integrated circuits in which these are employed, and especially the thin film integrated circuits for active type liquid crystal display devices (liquid crystal displays) for example, which are established on an insulating substrate such as glass for example, or on an insulating film which has been formed on various types of substrate, wherein silicon oxide films which have been formed by means of a PVD method or a CVD method are used as gate insulating films, and, they concern in particular methods of heat treatment for gate insulating films, and heat treatment apparatus, for obtaining gate insulating films which have good characteristics.

BACKGROUND OF THE INVENTION

Semiconductor devices wherein TFT are established on an insulating substrate such as glass, such as image sensors and active type liquid crystal display apparatus in which TFT are used to drive the picture elements for example, have been developed in recent years.

TFT in which silicon semiconductors are used in the form of a thin film have generally been used for the TFT in such devices. The thin film silicon semiconductors can be broadly classified into two types, namely those consisting of an amorphous silicon semiconductor and those consisting of a silicon semiconductor which has crystallinity. The amorphous silicon semiconductors can be manufactured comparatively easily with a gas phase method, having a low manufacturing temperature, and they are suitable for mass production, and so they are used most generally, but their properties, such as their electrical conductivity for example, are poor when compared with those of the silicon semiconductors which have crystallinity and so, in the future, there will be a considerable demand for the establishment of a method for the manufacture of TFT consisting of silicon semiconductors which have crystallinity in order to attain higher speeds.

The properties of the gate insulating film do not present much of a problem in the case of a TFT where amorphous silicon which has a small mobility has been used. For example, a silicon nitride film which has poor electrical characteristics when compared with silicon oxide can be used for the gate insulating film in a TFT in which amorphous silicon has been used. However, with a TFT in which a crystalline silicon film which has a high mobility is used, the characteristics of the gate insulating film which are about the same as those of the silicon film itself present a major problem.

A thermal oxide film is preferred for the gate insulating film. For example, a gate insulating film can be obtained using the thermal oxidation method if the substrate can withstand high temperatures, being a quartz substrate for example. (For example, JP-B-H3-71793) (The term "JP-B" as used herein signifies an "examined Japanese patent publication".)

A high temperature of at least 950° C. is required to obtain a silicon oxide film which is satisfactory for use as a gate insulating film using the thermal oxidation method. However, there are no other substrates except quartz which can withstand such high temperature treatment, and quartz substrates are expensive and, moreover, there has been a problem in that the production of larger areas has been difficult because the melting point is so high.

However, less expensive glass substrate materials have the problem that their distortion point is less than 750° C., usually 550–650° C., and thus the substrate cannot withstand high temperatures required to obtain a thermal oxide layer using normal methods. Consequently, gate insulating films have been formed using the physical gas phase growing methods (PVD methods, for example the sputter method) and chemical gas phase growing methods (CVD methods, for example the plasma CVD and photo CVD methods) with which they can be formed at lower temperatures.

However, insulating films which have been manufactured using PVD methods or CVD methods have a high concentration of hydrogen and unpaired bonds, for example, and furthermore the boundary surface characteristics are not good. They are therefore also weak in respect of the implantation of hot carriers for example, and centers for charge capture are easily formed, originating from the unpaired bonds and hydrogen. Consequently, when these films are used as gate insulating films for TFT, there is a problem in that the electric field mobility and the sub-threshold characteristic value (S value) are not good, or there are problems in that the gate electrode leakage current increases and the ON current is reduced (deterioration, change with the passage of time).

For example, generally, in those cases where the sputter method which is a PVD method is used, a film of a compound of essentially just oxygen and silicon is formed in principle if a synthetic quartz target comprising oxygen and silicon of high purity is used for the target. However, it is very difficult to obtain a silicon oxide film in which the proportions of oxygen and silicon in the film obtained are close to the stoichiometric ratio and in which there are few unpaired bonds. For example, oxygen is preferred as the sputter gas. However, oxygen has a low atomic weight and so the sputter rate (the accumulation rate) is low, and it is inappropriate as a sputter gas when mass production is being considered.

Furthermore, although a satisfactory rate of film formation can be obtained in an atmosphere of argon, for example, the proportions of oxygen and silicon differ from the stoichiometric ratio and the material obtained is very inappropriate as a gate insulating film.

Moreover, it is difficult to reduce the number of unpaired silicon bonds whatever the sputtering atmosphere, and the unpaired silicon bonds Si. or SiO. must be stabilized as Si—H and Si—OH by carrying out a heat treatment in a hydrogen atmosphere after film formation. However, the Si—H and Si—OH bonds are unstable and they are easily broken by accelerated electrons, and they inevitably revert back into unpaired silicon bonds. The presence of the weak Si—H and Si—OH bonds is the cause of the deterioration which is caused by hot carrier implantation mentioned above.

Similarly, a large amount of water in the form of Si—H and Si—OH is included in a silicon oxide film which has been manufactured using the plasma CVD method, and there are many unpaired bonds, and this also gives rise to the problems mentioned above. In addition, in those cases where tetraethoxysilane (TEOS) has been used as a source of silicon which can be handled comparatively easily, there is a problem in that a high concentration of carbon is included in the silicon oxide film. The present invention provides a means of resolving the problems described above.

SUMMARY OF THE INVENTION

It is known that silicon oxide films which have a low hydrogen concentration within the silicon oxide film, in which the nitrogen concentration within the silicon oxide film is increased, and which are ideal as gate insulating films can be obtained by subjecting silicon oxide films, for example silicon oxide films which have been formed by thermal oxidation, to a heat treatment at a temperature of at least 900° C. in an atmosphere of dinitrogen monoxide ($N_2O$).

Furthermore, according to research carried out by the inventors, a comparatively high concentration of carbon was included in silicon oxide films which have been formed using the plasma CVD method with TEOS as a raw material, but it was clear that the carbon in the silicon oxide was oxidized and eliminated from the silicon oxide film as carbon dioxide gas on heat treating at a temperature of at least 900° C. in an $N_2O$ atmosphere in the same way as described above.

However, the heat treatments carried out at this time are at a high temperature of at least 900° C. and so the process is only possible with substrates which have a high distortion point, such as quartz substrates. Consequently, the heat treatment cannot be introduced into the low temperature processes in which TFTs are formed using various glass substrates which have a distortion point below 750° C., and typically of 550–650° C.

The inventors have carried out research with a view to lowering the temperature of this reaction, and they have discovered that an effect similar to that obtained on heat treating at a temperature of at least 900° C. can be obtained on heat treating at 300–700° C., and preferably at 500–600° C., by irradiating with ultraviolet light during heat treatment in an $N_2O$ atmosphere. The wavelength of the ultraviolet light used at this time is set to 100–350 nm, and preferably to 150–300 nm.

The first invention is characterized by the fact that a silicon oxide film is improved so as to be satisfactory for use as a gate insulating film by heat treating a silicon oxide film, which has been formed by a PVD method or a CVD method, in an $N_2O$ atmosphere at 300–700° C., and preferably at 500–600° C., and irradiating with ultraviolet light at the same time. Heat treatment at 300–700° C., and preferably at 500–600° C. in a hydrogen atmosphere, or hydrogen nitride atmosphere such as an ammonia ($NH_3$) or hydrazine ($N_2H_4$) atmosphere, may be carried out prior to the abovementioned heat treatment/ultraviolet light irradiation process. Furthermore, irradiation with ultraviolet light in the same way as in the $N_2O$ atmosphere may be carried out in the heating process in a hydrogen or hydrogen nitride atmosphere.

The duration of the heat treatment in an $N_2O$ atmosphere depends on the characteristics of the silicon oxide film, the heat treatment temperature and the intensity of the ultraviolet light, for example, but, in consideration of mass production, it is preferably set to from 30 minutes to 6 hours. Furthermore, the rates of raising and lowering the substrate temperature in the heat treatment process should be determined for the execution of the invention but, in consideration of mass production, the rate at which the temperature is raised and the cooling rate are preferably from 5 to 30° C./min. Furthermore, the raising of the temperature and cooling may be carried out in a nitrogen atmosphere.

Furthermore, it is known that by subjecting silicon oxide films, for example silicon oxide films which have been formed by means of the thermal oxidation method, to a heat treatment at a temperature of at least 900° C. in an atmosphere of a hydrogen nitride, such as ammonia ($NH_3$) or hydrazine ($N_2H_4$) for example, nitriding is effected and the number of unpaired bonds is reduced, thereby increasing the concentration of nitrogen in the silicon oxide film and making it possible to obtain silicon oxide films which are ideal as gate insulating films.

However, the heat treatments carried out at this time are at a high temperature of at least 900° C. and so the process is only possible with substrates which have a high distortion point such as quartz substrates. Consequently, the heat treatment cannot be introduced into the low temperature processes in which the TFTs are formed using various glass substrates which have a distortion point below 750° C., and typically of 550–650° C.

The inventors have carried out research with a view to lowering the temperature of this reaction and they have discovered that the same effect as that obtained by carrying out a heat treatment at a temperature of at least 900° C. can be obtained with heat treatment at 300–700° C., and preferably at 500–600° C., by irradiating with ultraviolet light during a heat treatment in an $NH_3$ or $N_2H_4$ atmosphere. The wavelength of the ultraviolet light used at this time is set to 100–350 nm, and preferably to 150–300 nm.

The second invention is characterized by the fact that a silicon oxide film is improved so as to be satisfactory for use as a gate insulating film by heat treating a silicon oxide film, which has been formed by a PVD method or a CVD method, in a hydrogen nitride, such as $NH_3$ or $N_2H_4$, atmosphere at 300–700° C., and preferably at 500–600° C., and irradiating with ultraviolet light at the same time.

The duration of the heat treatment in the hydrogen nitride atmosphere depends on the characteristics of the silicon oxide film, the heat treatment temperature and the intensity of the ultraviolet light, for example, but, in consideration of mass production, it is preferably from 30 minutes to 6 hours. Furthermore, the rates of raising and lowering the substrate temperature in the heat treatment process should be determined for the execution of the invention but, in consideration of mass production, the rate at which the temperature is raised and the cooling rate are preferably from 5 to 30° C./min. Furthermore, the raising of the temperature and cooling may be carried out in a nitrogen atmosphere.

The third invention involves carrying out the heat treatment of a silicon oxide film which has been accumulated on an active layer, by means of a CVD method or a PVD method, at 300–700° C., and preferably at 500–600° C., in an atmosphere of dinitrogen monoxide ($N_2O$) while irradiating with ultraviolet light, and then replacing the atmosphere with a hydrogen nitride, such as ammonia ($NH_3$) or hydrazine ($N_2H_4$) for example, atmosphere and carrying out heat treatment at 300–700° C., and preferably at 500–600° C., in the said atmosphere while irradiating with ultraviolet light. At this time the wavelength of the ultraviolet light used is set to 100–350 nm, and preferably 150–300 nm.

In those cases where the abovementioned processes are carried out in a single reaction chamber it is necessary to change the atmosphere from $N_2O$ to hydrogen nitride. At this time it is desirable that the hydrogen nitride should be introduced after the $N_2O$ has been reduced to a satisfactorily low concentration. This is because there is a serious danger of explosion if $N_2O$ and hydrogen nitride are mixed together. Consequently, it is best if the hydrogen nitride is introduced after first evacuating the $N_2O$ atmosphere from the chamber. More easily, the $N_2O$ can be displaced with nitrogen to provide a nitrogen atmosphere, reducing the concentration of $N_2O$ satisfactorily, and the hydrogen nitride can be introduced subsequently.

In the abovementioned process involving two heat treatments the temperature may be raised and lowered for each of the heat treatment processes, or the temperature may be held essentially constant. Similarly, the irradiation with ultraviolet light may be started and stopped for each heat treatment in the two heat treatment processes, or it may be irradiated continuously.

The durations of the heat treatments in the $N_2O$ and hydrogen nitride atmospheres depend on the characteristics of the silicon oxide film, the heat treatment temperature and the intensity of the ultraviolet light, for example, but, in consideration of mass production, they are preferably from 30 minutes to 6 hours. Furthermore, the rates of raising and lowering the substrate temperature in the heat treatment processes should be determined for the execution of the invention but, in consideration of mass production, the rates at which the temperature is raised and the cooling rates are preferably from 5 to 30° C./min. Furthermore, the raising of the temperature and cooling may be carried out in a nitrogen atmosphere.

The fourth invention involves carrying out the heat treatment of a silicon oxide film which has been accumulated on an active layer, by means of a CVD method or a PVD method, at 300–700° C., and preferably at 500–600° C. in a hydrogen nitride atmosphere while irradiating with ultraviolet light and then replacing the atmosphere with an $N_2O$ atmosphere and carrying out a heat treatment at 300–700° C., and preferably at 500–600° C., in the said atmosphere while irradiating with ultraviolet light. At this time the wavelength of the ultraviolet light used is 100–350 nm, and preferably 150–300 nm.

The same precautions as in the third invention described above must be taken when changing the atmosphere from hydrogen nitride to $N_2O$ in the process described above. Furthermore, the raising and lowering of the temperature and the irradiation and interruption of the irradiation with ultraviolet light should be controlled in the same way as in the third invention. The durations of the heat treatments are also the same.

In this present invention, for example, the sputter method should be used as the PVD method and the plasma CVD method, the low pressure CVD method or the atmospheric pressure CVD method should be used as the CVD method. Other methods of film formation can also be used. Furthermore, methods in which TEOS is used as a raw material can also be used in the plasma CVD method or the low pressure CVD method. In the former case TEOS and oxygen are used for the raw material gas and the accumulation should be carried out at a substrate temperature of 200–500° C. In the latter case a silicon oxide film which is undamaged by the plasma can be obtained at a comparatively low temperature (for example at 375° C.±20° C.) using TEOS and ozone as raw materials.

Similarly, with the low pressure CVD method it is possible to reduce plasma damage of the active layer if monosilane ($SiH_4$) and oxygen gas ($O_2$) are used as the principal raw materials. Furthermore, the ECR-CVD method in which a discharge under ECR (electron cyclotron resonance) conditions is used from among the plasma CVD methods gives rise to less damage by the plasma and so it is possible to form even better gate insulating films.

The fifth invention concerns heat treatment apparatus which is appropriate for the execution of the abovementioned processes, and it provides heat treatment apparatus which is characterized by having a chamber for heat treatment purposes, a standby chamber in which the substrate is held before carrying out the heat treatment and in which the substrate is held after carrying out heat treatment, and a front chamber which is furnished with a transporting device for moving the substrate, in that a substrate holder which is furnished with a heater which heats the substrate is provided in the chamber for heat treatment purposes, and in that a light source for irradiating the substrate with ultraviolet light is provided outside or inside the chamber for heating the aforementioned substrate.

In order to provide a further increase in productivity, the substrate holder inside the chamber in this apparatus may be a generally (roughly) conveyor-like transporting device which is made of a heat resistant metal, and the heat treatment can be carried out while the substrate is being moved. Furthermore, the substrate holder in the chamber for heating the substrate may take the form of a generally conveyor-like transporting device which is made of a heat resistant metal, and a plurality of substrates may be taken up and heat treated at the same time. Moreover, a heater may be established in the lower part of the generally conveyor-like transporting device.

Other apparatus of the invention has a cylindrical chamber with heaters established around the perimeter of the aforementioned cylindrical chamber for heating the substrates, and a light source for irradiating the substrates with ultraviolet light is established in the center of the aforementioned cylindrical chamber, and the construction is such that substrates are taken up in such a way as to be arranged along the inner wall of the aforementioned cylindrical chamber. With such an arrangement, the ultraviolet light can be utilized effectively and productivity can be improved.

A reaction chamber which has a device with which the atmosphere can be controlled and a device for ultraviolet light irradiation is required for the execution of the third and fourth inventions described above. In practical terms, this is heat treatment apparatus which is characterized by having a chamber for heat treatment, a standby chamber in which the substrates are held before carrying out the heat treatment and the substrates are held after carrying out heat treatment, and a front chamber which is furnished with a transporting device for moving the substrate, in that a substrate holder which is furnished with a heater which heats the substrate is provided in the chamber for heat treatment, and in that a light source for irradiating the substrate with ultraviolet light is provided outside or inside the chamber for heating the aforementioned substrates. Furthermore, it may have a plurality of chambers so that the heat treatment in an $N_2O$ atmosphere and the heat treatment in a hydrogen nitride atmosphere can be carried out in different chambers.

In order to provide a further increase in productivity, the substrate holder inside the chamber in this apparatus may be a transporting device such as a generally conveyor-like system which is made of a heat resistant metal, and the heat treatment can be carried out while the substrate is being moved. Furthermore, the substrate holder in the chamber for heating the substrate may take the form of a generally conveyor-like transporting device which is made of a heat resistant metal, and a plurality of substrates may be taken up and heat treated at the same time. Moreover, a heater may be established in the lower part of the outline conveyor-like transporting device.

When a silicon oxide film which has been formed by means of a CVD method or a PVD method is heat treated in an $N_2O$ atmosphere at a temperature of 900° C. or above, unpaired bonds may be taken up with nitrogen, and the Si—H bonds and Si—OH bonds in the silicon oxide film are converted to the nitride or the oxide, becoming Si≡N or $Si_2$=N—O bonds, and the hydrogen content in the silicon oxide film is reduced. These reactions are liable to proceed in particular at the boundary between the silicon oxide and silicon and, as a result, the nitrogen is concentrated at the silicon oxide/silicon boundary. The amount of nitrogen which is added and concentrated close to the boundary with such a technique is at least ten times the average concentration in the silicon oxide film. The inclusion of 0.1–10 atom. %, and typically the inclusion of 1–5 atom. %, of nitrogen in the silicon oxide is desirable for a gate insulating film.

Consequently, the unpaired bonds and the Si—H bonds and Si—OH bonds which are weak bonds and easily broken by hot carriers at the boundary between the gate insulating film and the active layer are converted to Si≡N bonds and $Si_2$≡N—O bonds, for example, which are strong bonds, and the extent of any change in the chemical state due to hot carriers is greatly reduced.

In this way, the durability with respect to hot carriers is improved by converting the unpaired bonds, Si—H bonds and Si—OH bonds in the silicon oxide film, and especially in the vicinity of the boundary with the silicon film, to nitride or oxide, and when the silicon oxide film was used as a gate insulating film for a TFT, the effect was to improve the electric field mobility and the sub-threshold characteristic value (S value) and to prevent any falloff in the ON current (deterioration, change with the passage of time).

Reactions of the type indicated above proceed only on heat treatment at a temperature of at least 900° C. It has been concluded that this is principally because the temperature required to break down $N_2O$ is at least 900° C. However, the temperature can be reduced if irradiation with ultraviolet light is used conjointly. The wavelength of the ultraviolet light used at this time is 100–350 nm, and preferably 150–300 nm. It has been concluded that this is because a high temperature as described above is not required since the $N_2O$ is broken down by the ultraviolet light, and the same reactions as indicated above can proceed even on heat treatment at 300–700° C., and preferably at 500–600° C. Furthermore, the Si—OH bonds, Si—H bonds and the unpaired bonds in particular in a silicon oxide film which is being irradiated with ultraviolet light readily absorb the ultraviolet light and, as a result, a state of chemical excitation arises in these parts, and it is thought that this also promotes chemical reaction. The facts indicated above have been readily verified by means of the experiments described below.

Samples where a silicon oxide film had been formed with a thickness of 1200 Å using the plasma CVD method with TEOS and oxygen as raw materials on a silicon wafer were used in the experiments. The sample was heat treated in an $N_2O$ atmosphere while being irradiated with ultraviolet light and the nitrogen concentration was then investigated using the secondary ion mass spectroscopy (SIMS) method. The results obtained are shown in FIG. 9. Here, FIG. 9(A) is the concentration profile in the depth direction of a sample which had been heat treated for 3 hours at 400° C. in an $N_2O$ atmosphere with conjoint irradiation with ultraviolet light. For comparison, the concentration profile in the depth direction of the sample before annealing is shown in FIG. 9(B).

From this analysis it is confirmed that on looking at a sample which has been annealed at 400° C. in a dinitrogen monoxide atmosphere with the conjoint use of irradiation with ultraviolet light shown in FIG. 9(A), the nitrogen concentration at the boundary between the silicon oxide and the silicon is higher by an order of magnitude when compared with the sample before carrying out the anneal.

Moreover, the unpaired bonds of the silicon are difficult to convert to nitride or oxide with the abovementioned ultraviolet light irradiation and heat treatment in an $N_2O$ atmosphere. By heat treating at a suitable temperature (300–700° C., and preferably 500–600° C.) in an atmosphere of hydrogen or a hydrogen nitride, such as ammonia ($NH_3$) or hydrazine ($N_2H_4$) for example, the unpaired bonds Si. may be converted to Si—H bonds in order to promote reaction. The reaction is facilitated if irradiation with ultraviolet light is carried out at this time. Stable bonds can then be obtained by means of the reaction described above if heat treatment in an $N_2O$ atmosphere/ultraviolet irradiation process is carried out subsequently. Moreover, on treatment in a hydrogen nitride atmosphere, the Si—H bonds and Si=O bonds are converted to the nitride and form Si N or Si—N=$H_2$ bonds.

The effect is especially pronounced in those cases where the invention is applied to silicon oxide films which have been formed using the sputter method (and especially the silicon oxide films in which the oxygen concentration is less than the stoichiometric ratio obtained with argon, for example, as the sputter atmosphere). This is because the deficient oxygen can be supplemented by heat treating such a film in an $N_2O$ atmosphere and the composition of the silicon oxide film can be made to approach the stoichiometric ratio.

A silicon oxide film which has been formed using a sputter method of this type can be subjected to a heat treatment at a suitable temperature in an atmosphere of hydrogen or a hydrogen nitride, such as ammonia ($NH_3$) or hydrazine ($N_2H_4$) for example, and the unpaired bonds Si. can be converted to Si—H bonds before carrying out the heat treatment in an $N_2O$ atmosphere. The oxidation by heat treatment in an $N_2O$ atmosphere is further facilitated by this means.

The facts outlined above show that the formation of silicon oxide films by means of the sputter method is not disadvantageous. That is to say, conventionally, the formation of silicon oxide films by the sputter method has only been carried out under limited atmospheric conditions to provide a composition approaching the stoichiometric ratio. For example, when mixtures of oxygen and argon have been considered for the atmosphere, the condition that oxygen/argon>1 had to be fulfilled and, for preference, it has been desirable that the treatment should be carried out in a pure oxygen atmosphere. Consequently, the rate of film formation has been low and this has not been suitable for mass production. Furthermore, oxygen is a reactive gas and problems have arisen with oxidation of the vacuum apparatus and the chamber for example.

However, with this present invention, even silicon oxide films which have a composition far remote from the stoichiometric composition can be converted to silicon oxide films which are suitable for use as gate insulating films, and so even with the same oxygen/argon mixed atmospheres the reaction can be carried out under useful conditions in terms of the rate of film formation such that the oxygen/argon ratio is less than or equal to 1. For example, the rate of film formation is very high with an atmosphere of pure argon, and film formation can be achieved under stable conditions.

The invention provides a special effect when it is applied to silicon oxide films which have been formed by means of the plasma CVD method using a silicon source which contains carbon, such as TEOS for example. Carbon is included in large amounts in these silicon oxide films, and the carbon which is present at the boundary with the silicon film in particular causes a fall off of the TFT characteristics. Oxidation is promoted by heat treatment in an $N_2O$ atmosphere in this invention, and the carbon is also oxidized at this time and released from the system as carbon dioxide gas, and so the carbon content of the film can be reduced.

As a result, by making use of the present invention, the hydrogen and carbon concentrations in a silicon oxide film which has been formed by the plasma CVD method with TEOS as a raw material gas can be reduced, and the nitrogen concentration can be increased, while maintaining a low temperature of 300–700° C. Thus, TFT in which such a silicon oxide film is used as a gate insulating film exhibit excellent characteristics and high reliability.

When a silicon oxide film which has been formed by means of a CVD method or a PVD method is heat treated in an $NH_3$ or $N_2H_4$ atmosphere at a temperature of 900° C. or above, unpaired bonds may be taken up with nitrogen, and the Si—H bonds and Si—OH bonds in the silicon oxide film are converted to the nitride, or the oxide, becoming $Si\equiv N$ or $Si_2=N$—H bonds, and the nitrogen content in the silicon oxide film is increased. In particular, this reaction is liable to proceed at the boundary between the silicon oxide and silicon and, as a result, the nitrogen is concentrated at the silicon oxide—silicon boundary. The amount of nitrogen which is added and concentrated close to the boundary with such a technique is at least ten times the average concentration in the silicon oxide film. The inclusion of 0.1–10 atom. %, and typically the inclusion of 1–5 atom. %, of nitrogen in the silicon oxide is desirable for a gate insulating film.

Consequently, the unpaired bonds and the Si—H bonds and Si—OH bonds which are weak bonds and easily broken by hot carriers at the boundary between the gate insulating film and the active layer are converted to $Si\equiv N$ bonds and $Si_2=N$—O bonds, for example, which are strong bonds, and the change in the chemical state due to hot carriers is greatly reduced.

In this way, the durability with respect to hot carriers is improved by converting the unpaired bonds, Si—H bonds and Si—OH bonds in the silicon oxide film, and especially in the vicinity of the boundary with the silicon film, to nitride or oxide, and when used as a gate insulating film for a TFT, the effect is to improve the electric field mobility and the sub-threshold characteristic value (S value) and to prevent any falloff in the ON current (deterioration, change with the passage of time).

Reactions of the type indicated above proceed only with heat treatment at a temperature of at least 900° C. It has been concluded that this is principally because the temperature required to break down $NH_3$ and $N_2H_4$ is at least 900° C. However, the temperature can be reduced if irradiation with ultraviolet light is used conjointly. The wavelength of the ultraviolet light used at this time is 100–350 nm, and preferably 150–300 nm. It has been concluded that this is because such a high temperature as described above is not required since the $NH_3$ and $N_2H_4$ are broken down by the ultraviolet light, and the same reactions as indicated above can proceed even on heat treatment at 300–700° C., and preferably at 500–600° C. Furthermore, the Si—OH bonds, Si—H bonds and the unpaired bonds in particular in a silicon oxide film which is being irradiated with ultraviolet light readily absorb the ultraviolet light and, as a result, a state of chemical excitation arises in these parts, and it is thought that this also promotes chemical reaction.

The effect is especially pronounced in those cases where the invention is applied to silicon oxide films which have been formed using the sputter method (and especially the silicon oxide films in which the oxygen concentration is less than the stoichiometric amount obtained with argon, for example, as the sputter atmosphere). That is to say, such a film has many unpaired bonds but, on heat treating in a hydrogen nitride atmosphere, such as an $NH_3$ or $N_2H_4$ atmosphere at 300–700° C., and preferably at 500–600° C., while irradiating with ultraviolet light, the unpaired bonds are formed into nitrides and nitrogen is bonded instead of the oxygen which is deficient in terms of the stoichiometric ratio, and it is possible to form a silicon oxide film which has few unpaired bonds.

Such effects can also be obtained with silicon oxide films which have been formed with PVD methods other than the sputter method, or with various CVD methods. It is possible by using this invention in this way to reduce the number of unpaired bonds in a silicon oxide film which has been formed using a PVD method or a CVD method and to raise the nitrogen concentration while using a low temperature of 300–700° C. Thus, TFT in which such a silicon oxide film is used as a gate insulating film exhibit excellent characteristics and high reliability.

If the treatment described in the third invention is carried out with a silicon oxide film which has been formed with a CVD method or PVD method then the Si—H bonds and Si—OH bonds in the silicon oxide film are converted to nitrides or oxides by the initial heat treatment in an $N_2O$ atmosphere, and they are converted to $Si\equiv N$ or $Si_2=N$—O bonds, and the hydrogen content of the silicon oxide film is reduced.

Moreover, by means of the subsequent heat treatment in a hydrogen nitride atmosphere, the unpaired bonds (dangling bonds) which cannot take part in the reaction described above are converted to nitride or nitro-hydride and become stable.

The effect of the irradiation with ultraviolet light (wavelength 100–350 nm, and preferably 150–300 nm) in this present invention is very great. That is to say, the abovementioned reactions do not proceed at all in the absence of irradiation with ultraviolet light. A temperature of at least 900° C. is required to realize such a reaction by means of pure heat treatment. That is to say, this is because the temperature required to break down $N_2O$ or hydrogen nitrides thermally is at least 900° C.

However, the abovementioned reactions can be realized at lower temperatures by irradiating with ultraviolet light. It has been concluded that this is because in the first place such a high temperature as described above is not required since the $N_2O$ and hydrogen nitrides are broken down by the ultraviolet light, and the same reactions as indicated above can proceed even on heat treatment at 300–700° C., and preferably at 500–600° C.

Furthermore, the Si—OH bonds, Si—H bonds and the unpaired bonds in particular in a silicon oxide film which is being irradiated with ultraviolet light readily absorb ultraviolet light and, as a result, a state of chemical excitation arises in these parts, and it is thought that this also promotes chemical reaction. The reaction proceeds readily at the boundary between silicon oxide and silicon and, as a result, the nitrogen tends to be concentrated at the silicon oxide—silicon boundary.

The amount of nitrogen which is added and concentrated in the vicinity of the boundary with such a technique is at least ten times the average concentration for the silicon oxide film. The inclusion of 0.1–10 atom. %, and typically the inclusion of 1–5 atom. %, of nitrogen in the silicon oxide is desirable for a gate insulating film.

Consequently, the unpaired bonds and the Si—H bonds and Si—OH bonds which are weak bonds and easily broken by hot carriers at the boundary between the gate insulating film and the active layer are converted to Si N bonds and $Si_2$=N—O bonds, for example, which are strong bonds, and the change in the chemical state due to hot carriers is greatly reduced.

In this way, the durability with respect to hot carriers is improved by converting the unpaired bonds, Si—H bonds and Si—OH bonds in the silicon oxide film, and especially in the vicinity of the boundary with the silicon film, to nitride or oxide, and when used as a gate insulating film for a TFT, the effect is to improve the electric field mobility and the sub-threshold characteristic value (S value) and to prevent any falloff in the ON current (deterioration, change with the passage of time).

The effect is especially pronounced in those cases where the invention is applied to silicon oxide films which have been formed using the sputter method (and especially the silicon oxide films in which the oxygen concentration is less than the stoichiometric ratio obtained with argon, for example, as the sputter atmosphere). This is because the deficient oxygen can be supplemented by heat treating such a film in an $N_2O$ atmosphere and the composition of the silicon oxide film can be made to approach the stoichiometric ratio. The unpaired bonds which are not dealt with by the heat treatment in an $N_2O$ atmosphere are converted to nitride by means of a subsequent heat treatment in a hydrogen nitride atmosphere.

If a treatment as described in the fourth invention is carried out with a silicon oxide film which has been formed using a CVD method or a PVD method then the unpaired bonds, Si—H bonds and Si—OH bonds in the silicon oxide film are converted to nitride by the initial heat treatment in a hydrogen nitride atmosphere and converted to Si≡N or Si—N=$H_2$ bonds.

Moreover, the nitrogen hydride groups ($NH_2$ groups for example), which are formed in the abovementioned reaction are converted to nitride or oxide by the succeeding heat treatment in an $N_2O$ atmosphere and form Si≡N bonds and $Si_2$=N—O bonds for example. The effect of the irradiation with ultraviolet light in the abovementioned reactions is very great, as in the case of the third invention.

The amount of nitrogen which is added to and concentrated in the vicinity of the boundary with such a technique is at least ten times the average concentration for the silicon oxide film. The inclusion of 0.1–10 atom. %, and typically the inclusion of 1–5 atom. %, of nitrogen in the silicon oxide is desirable for a gate insulating film.

In this way, the durability with respect to hot carriers is improved by converting the unpaired bonds, Si—H bonds and Si—OH bonds in the silicon oxide film, and especially in the vicinity of the boundary with the silicon film, to nitride or oxide, and when used as a gate insulating film for a TFT, the effect is to improve the electric field mobility and the sub-threshold characteristic value (S value) and to prevent any falloff in the ON current (deterioration, change with the passage of time).

The effect when the invention is applied to a silicon oxide film which has been formed with the sputter method (and especially a silicon oxide film in which the oxygen concentration is less than the stoichiometric ratio using argon, for example for the sputter gas), and the effect when it is applied to a silicon oxide film which has been formed with the plasma CVD method using a silicon source which contains carbon, such as TEOS for example, are the same as in the third invention.

DETAILED DESCRIPTION OF THE PREFERRED EMBODIMENTS

EXAMPLE 1

Figure 1A:
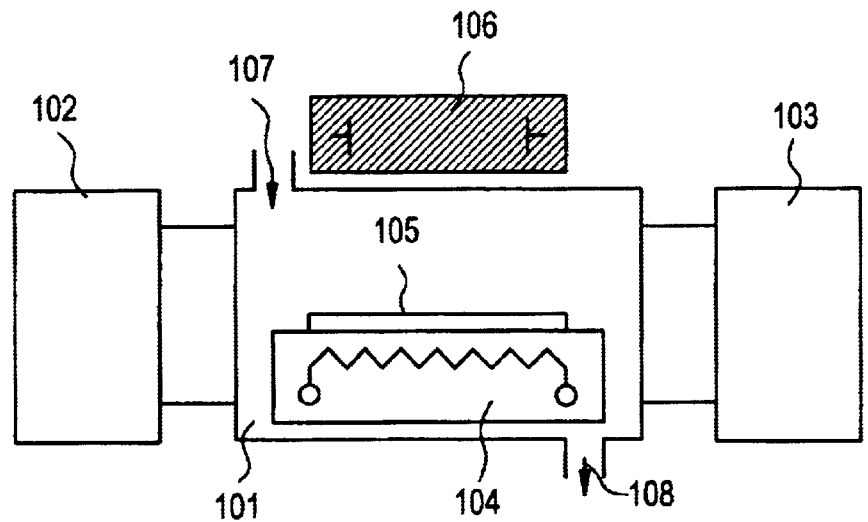
FIG. 1 shows heat treatment apparatus according to Example 1.

This illustrative example is an example in which a silicon oxide film which has been formed with a plasma CVD method is modified by means of a heat treatment in an $N_2O$ atmosphere while being irradiated with ultraviolet light and in which an N-channel TFT is formed using this as a gate insulating film. The manufacturing process of the TFT in this example is shown in FIG. 7, and an outline of the apparatus used for the heat/ultraviolet irradiation treatment of the silicon oxide film mentioned above is shown in FIG. 1.

First of all, the silicon oxide film 702 base was formed with a thickness of 3000 Å using the plasma CVD method on the substrate 701. Then, an amorphous silicon film was formed with a thickness of 500 Å using the plasma CVD method. After this, a heat treatment was carried out in an $N_2$ atmosphere and the amorphous silicon film was crystallized. A trace amount of an element which promotes the crystallization of amorphous silicon, such as nickel for example, may be added in order to promote the crystallization of the amorphous silicon at this time. Furthermore, laser annealing may be used to improve crystallization. (FIG. 7(A))

Next, the crystallized silicon film 703 and the island region 704 was formed. This island-like region 704 is the active layer of the TFT. The silicon oxide film 705 of thickness 1000 Å was then formed as a gate insulating film. In this illustrative example, the silicon oxide film was produced using the three different methods 1–3 indicated below. (FIG. 7(B))

In method 1, the film was formed with the plasma CVD method using TEOS as a raw material. The TEOS which had been vaporized in a vaporizer and oxygen were introduced into a chamber which had parallel plate-type electrodes, RF power (for example, frequency 13.56 MHz) was introduced and a plasma was formed, and the accumulation was made at a substrate temperature of 200–500 °C., and preferably of 250–400° C. In this illustrative example the reaction pressure was 4 Pa, the power input was 150 W and the substrate temperature was set at 350° C.

Method 2 was the sputter method. In this case synthetic quartz was used for the target and the film was formed by sputtering in a 100% oxygen atmosphere at a pressure of 1 Pa. The power input was 350 W and the substrate temperature was set at 200° C.

Method 3 was the ECR-CVD method, and oxygen and monosilane ($SiH_4$) were used as the raw material gases. Nitrogen oxides, such as $N_2O$, NO and $NO_2$ for example, could be used in place of the oxygen. Furthermore, the film forming conditions at this time were a microwave power input (frequency 2.45 MHz) of 400 W without heating the substrate.

Figure 1B:
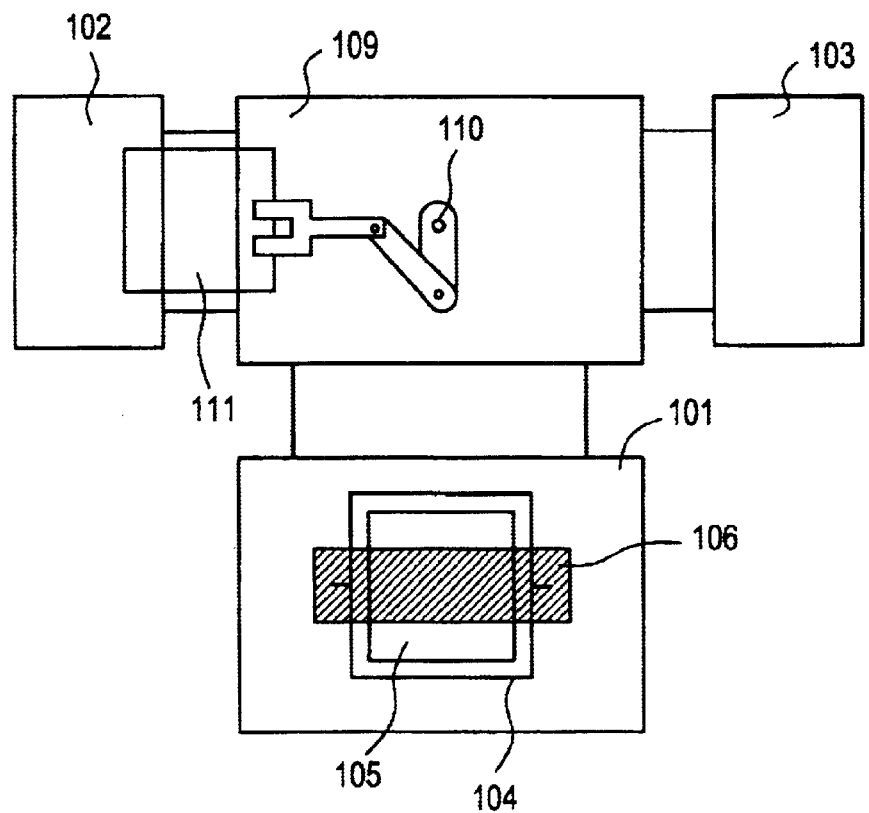

Subsequently, heat treatments were carried out in an $N_2O$ atmosphere using the heat treatment apparatus shown in FIG. 1. As shown in FIG. 1, the heat treatment apparatus used in this illustrative example was constructed with a chamber 101 for carrying out the heat treatment, a standby chamber 102 in which the substrate was held before treatment, a standby chamber 103 in which the substrate was held after treatment and a front chamber 109 which was furnished with the transporting device 110, and the substrate 111 was moved between these chambers by means of the transporting device 110. Moreover, in this illustrative example a single substrate type system with which one substrate was treated at a time was used in the chamber 101.

Furthermore, the chamber 101 had a substrate holder 104 which had a heater installed in the bottom for heating the substrate 105. Moreover, the ultraviolet light source 106 was established outside the chamber 101. A low pressure mercury lamp (center wavelength 246 nm and 185 nm) was used for the ultraviolet light source in this illustrative example. The top part of the chamber 101 to which the ultraviolet light source 106 was fitted was formed with a window of a material which did not absorb ultraviolet light, such as quartz for example, so that the ultraviolet light could enter the chamber. Moreover, in this illustrative example the ultraviolet light source was established outside the chamber, but it could have been established inside the chamber.

Furthermore, the exhausting system 108 for evacuating the gases and the gas supply system 107 for introducing the gases were established in the chamber 101 and the front chamber 109.

First of all, the untreated substrate was set in a multisubstrate cassette and this was set in the standby chamber 102. Then, the substrate was moved into the front chamber 109 by the transporting device 110 and the pressure in the front chamber was reduced by evacuation with the exhausting system, after which the substrate was moved into the chamber 101 for heat treatment purposes in which the pressure had already been reduced, and located on the substrate holder 104.

Then, $N_2O$ gas was introduced into the chamber 101 via the gas supply system 107 and a heat treatment was carried out while irradiating with ultraviolet light in an essentially 100% $N_2O$ atmosphere with the pressure inside the chamber set to atmospheric pressure. At this time the heating temperature was 350–600° C., and it was set, for example, to 500° C. Furthermore, the treatment time was from 30 minutes to 6 hours, and the heat treatment was carried out, for example, for 3 hours.

After carrying out the heat treatment in this way, the treated substrate was moved into the front chamber 109 by the transporting device 110 and then it was set in a cassette in the standby chamber 103 in which the substrates were held after treatment, and the treatment process of one substrate was completed. This same process was then carried out repeatedly.

The heat treatment of the present invention was carried out in the way outlined above and, as a result, an effect similar to that obtained on carrying out a heat treatment at 900° C. in an $N_2O$ atmosphere was obtained by means of a heat treatment at 500° C.

Next, the samples which had been heat treated with the conjoint use of ultraviolet light were analyzed using the secondary ion mass spectrometry (SIMS) and the results obtained confirmed that, in the silicon oxide film, and especially in the silicon oxide film which had been prepared using method 1 (the plasma CVD method with TEOS) described above, the amount of carbon (C) at the boundary with the silicon film was reduced and the amount of nitrogen (N) was increased. Furthermore, it was confirmed that there was a decrease in hydrogen (H) at the same time. Furthermore, it was similarly confirmed that there was an increase in the nitrogen concentration at the silicon/silicon oxide boundary in the silicon oxide films which had been formed using method 2 (the sputter method) and method 3 (the ECR-CVD method). Silicon oxide films which have such a composition are preferred as gate insulating films.

No change was observed in the nitrogen, hydrogen and carbon concentrations when silicon oxide films which had been formed using the methods 1–3 described above were heated in the apparatus shown in FIG. 1 under the same temperature conditions in an atmosphere of nitrogen instead of $N_2O$ for comparison.

Subsequently, an aluminum (containing 1 wt % Si or 0.1–0.3 wt % Sc) film of thickness 5000 Å was formed by a sputtering method and this was etched to form the gate electrode 706. Then, the substrate was immersed in an ethylene glycol solution of 1–3% tartaric acid which had been adjusted to pH about 7 with ammonia and anodic oxidation was carried out using a platinum cathode and the aluminum gate electrode for the anode. The anodic oxidation was completed by raising the voltage up to 120 V at the initial fixed current and maintaining this condition for 1 hour. An anodic oxide of thickness 1500 Å was formed in this way.

After this, an impurity (phosphorus in this case) was implanted into the island-like silicon film 704 by means of the ion doping method, with self-arrangement, using the gate electrode 706 as a mask. The extent of doping in this case was $1 \times 10^{14} – 5 \times 10^{15}$ atom/$cm^2$ and the accelerating voltage was 10–90 kV and, for example, the extent of doping was set to $1 \times 10^{15}$ atom/$cm^2$ and the accelerating voltage was set to 80 kV. The N-type impurity regions 707 were formed as a result of this procedure. (FIG. 7(C))

Moreover, activation of the doped impurity regions 707 was carried out by irradiation with a KrF excimer laser (wavelength 248 nm, pulse width 20 nsec). The appropriate energy density of the laser was 200–400 mJ/cm$^2$, and preferably 250–300 mJ/cm$^2$. This process could also have been carried out by means of a heat treatment.

Next, a silicon oxide film of thickness 4000 Å was formed by means of the plasma CVD method for the interlayer insulating film 708. (FIG. 7(D))

Then, the interlayer insulating film 708 and the gate insulating film 705 were etched and the source/drain contact holes were formed. Subsequently, an aluminum film was formed by means of the sputtering method, patterning was carried out, the source/drain electrodes 709 were formed, and the N-channel type TFT was completed.

The deterioration of the TFT produced in this illustrative example was evaluated. The TFT manufacturing process was just the same in all cases except that the method of preparing the gate insulating film (any of the methods 1–3) and the method of heat treating the gate insulating film (N$_2$O atmosphere/ultraviolet light irradiation/500° C./3 hours (the abovementioned conditions are denoted by "N$_2$O atmosphere") or N$_2$ atmosphere/no ultraviolet light irradiation/500° C./3 hours (the abovementioned conditions are denoted by "N$_2$ atmosphere")) were varied as indicated in the table below. The TFT obtained were set-to a drain voltage of +14 V and the gate voltage was varied from −17 V to +17 V, and the drain current was measured. The measurement was made ten times, the electric field effect mobility $\mu_{10}$ obtained by measurement on the tenth occasion was compared with the electric field effect mobility $\mu_o$ obtained on the initial measurement and the value $1-(\mu_{10}/\mu_o)$ was defined as the deterioration factor. The results obtained are shown in the table below. (A minus sign for the deterioration factor signifies that the mobility had increased.)

| Sample | Film Forming Method | Heat Treatment | Deteriorating Factor |
|---|---|---|---|
| A-1 | No.1 (Plasma CVD with TEOS) | N$_2$O atmosphere | 3.5% |
| A-2 | No.1 (plasma CVD with TEOS) | N$_2$ atmosphere | 50.6% |
| B-1 | No.2 (Sputter method) | N$_2$O atmosphere | −2.6% |
| B-2 | No.2 (Sputter method) | N$_2$ atmosphere | 12.5% |
| C-1 | No.3 (ECR-CVD method) | N$_2$O atmosphere | 0.8% |
| C-2 | No.3 (ECR-CVD method) | N$_2$ atmosphere | 21.6% |

With all of the samples it is clear that the deterioration factor was greatly reduced by irradiating with ultraviolet light when carrying out the heat treatment in an N$_2$O atmosphere of thins present invention. Furthermore, it was also clear from a similar experiment that no improvement was seen in the deterioration factor if there was no irradiation with ultraviolet light when carrying out the heat treatment in an N$_2$O atmosphere.

The TFT which had been manufactured in this illustrative example had good durability and little deterioration even though a silicon oxide film which had been prepared using a PVD method or a CVD method was used for the gate insulating film, and TFT which had excellent characteristics were obtained. This is due to the fact that the amounts of carbon and hydrogen in the silicon oxide film were reduced and the amount of nitrogen was increased by the heat treatment carried out with the conjoint use of ultraviolet light irradiation carried out in an N$_2$O atmosphere in accordance with the present invention.

EXAMPLE 2

Figure 2A:
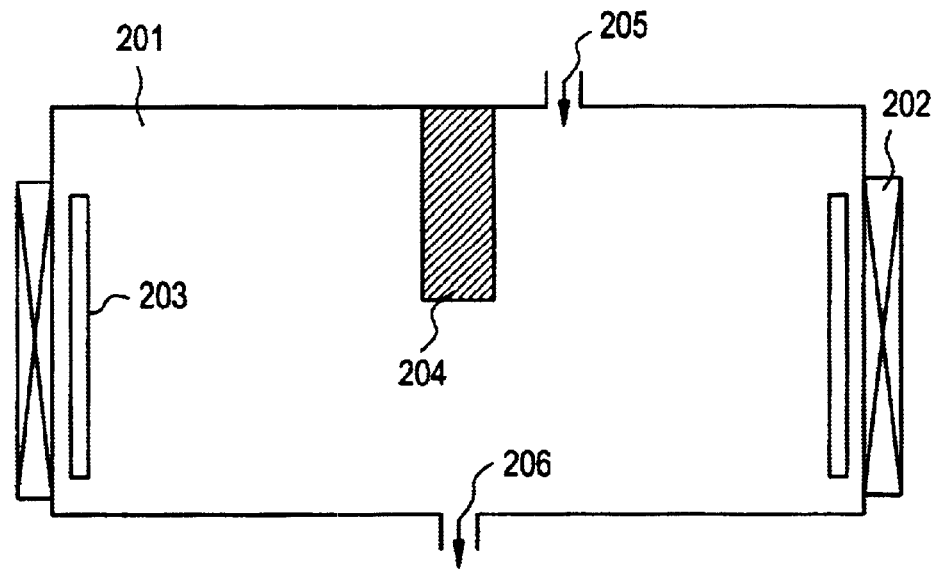
FIG. 2 shows heat treatment apparatus according to Example 2.
Figure 2B:
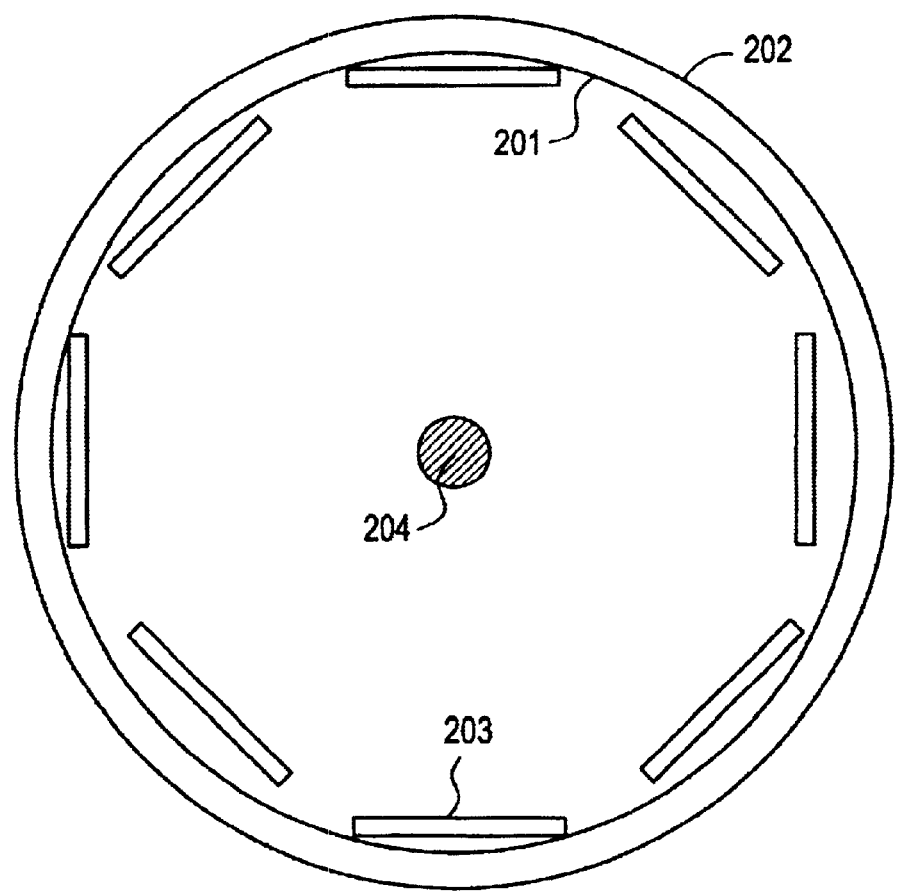

This illustrative example is an example in which silicon oxide films which had been formed on a silicon film by means of the plasma CVD method with TEOS as the raw material are heat treated using the heat treatment apparatus shown in FIG. 2. The silicon oxide films used in this illustrative example were formed using method 1 for the silicon oxide film 705 in Illustrative Example 1 (see FIG. 7(B)).

As shown in FIG. 2, the heat treatment apparatus used in this illustrative example was different from the single substrate chamber shown in Illustrative Example 1, and in this case it was constructed with just a chamber for carrying out the heat treatment and it provided a batch system with which a plurality of sheets could be treated at the same time.

The chamber 201 in this illustrative example was cylindrical in shape, and it was such that the substrates 203 could be established around the inner wall. Moreover, the substrates 203 could be heated by the heaters 202 which were established around the circumference of the chamber 201. Moreover, the ultraviolet light source 204 was established in the middle of the chamber 201 in such a way that ultraviolet light was irradiated equally onto all of the substrates. A low pressure mercury lamp (center wavelength 246 nm and 185 nm) was used for the ultraviolet light source in this illustrative example.

Furthermore, the exhausting system 206 for carrying out evacuation and the gas supply system 205 for introducing gas were established in the chamber.

The method of treatment using this apparatus will now be described. First of all the substrates 203 were set around the inner wall of the chamber 201 in such a way as to surround the ultraviolet light source 204. Then, N$_2$ gas was introduced into the chamber 201 from the gas supply system and the interior of the chamber was displaced with N$_2$. At this time, gas was evacuated via the evacuating system 206 and a constant pressure was generally maintained within the chamber.

Next, after displacing the interior of the chamber with N$_2$, the heaters were heated and ultraviolet irradiation was carried out. At this time the heating temperature was 300–700° C., and it was set, for example, to 500° C.

After heating the substrates to the prescribed temperature, the N$_2$ was replaced with N$_2$O and irradiation with ultraviolet light was carried out. At this time, the duration of the treatment was from 30 minutes to 6 hours, and the treatment was carried out, for example, for 4 hours.

The silicon oxide films obtained on carrying out the abovementioned treatment were analyzed using secondary ion mass spectroscopy (SIMS) and it was observed that the amount of nitrogen had increased above the nitrogen concentration included in the silicon oxide film initially and that the amounts of carbon and hydrogen had been reduced, and that there was, in particular, an accumulation of nitrogen at the boundary with the silicon film.

EXAMPLE 3

Figure 3:
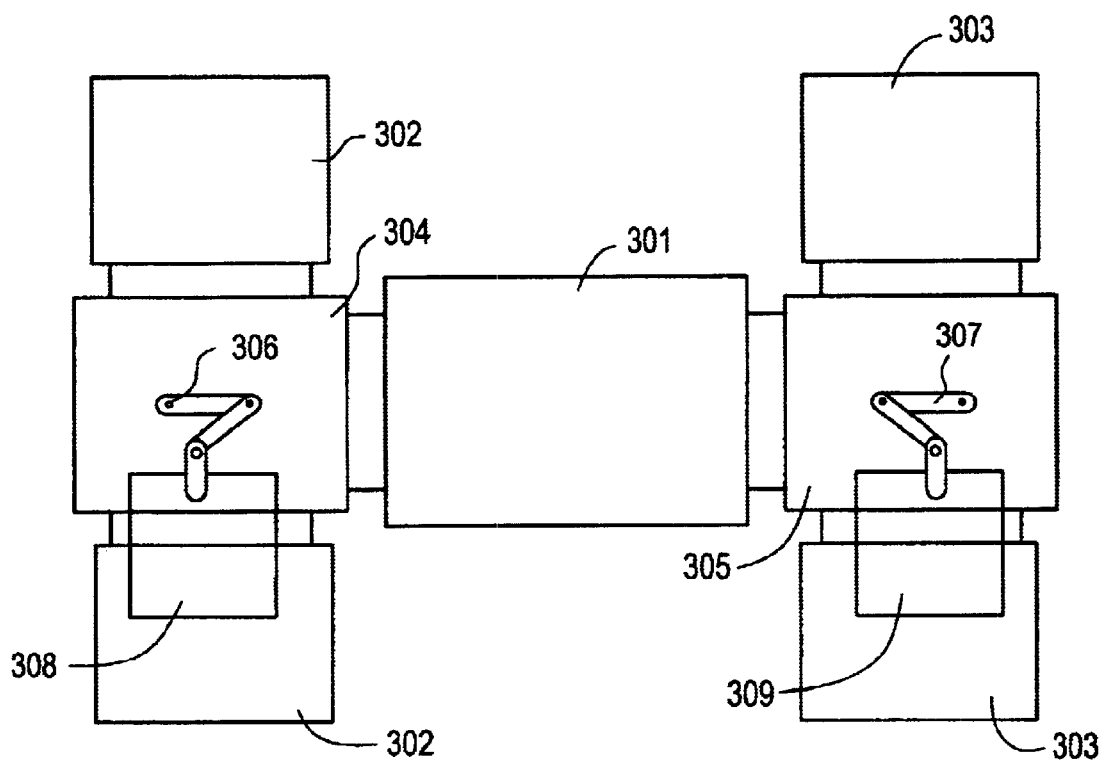
FIG. 3 shows heat treatment apparatus according to Example 3.

This illustrative example is an example in which silicon oxide films which had been formed on a silicon film by means of the plasma CVD method with TEOS as the raw material were heat treated using the heat treatment apparatus shown in FIG. 3. The silicon oxide films used in this illustrative example were formed using method 1 for the silicon oxide film 705 (see FIG. 7(B)) of Illustrative Example 1.

As shown in FIG. 3, the heat treatment apparatus used in this illustrative example was constructed from the chamber 301 for carrying out heat treatment, the standby chamber 302 in which the substrates were held before treatment, the standby chamber 303 in which the substrates were held after treatment and the front chambers 304 and 305 which were furnished with the transporting devices 306 and 307, and the substrates 308 and 309 were moved between these chambers by means of the transporting devices 306 and 307. Moreover, in this illustrative example, the chamber for carrying out the heat treatment was of the batch type in which heat treatment could be carried out while moving a plurality of substrates at the same time by means of a conveyor.

Figure 4A:
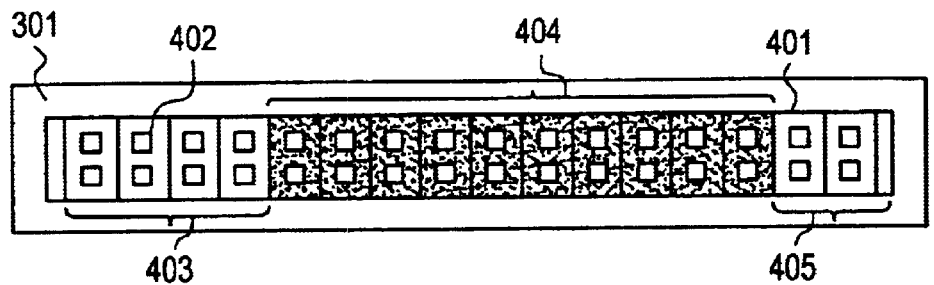
FIG. 4 shows the interior of the chamber of the heat treatment apparatus according to Example 3 and the temperature gradient during heating.
Figure 4B:
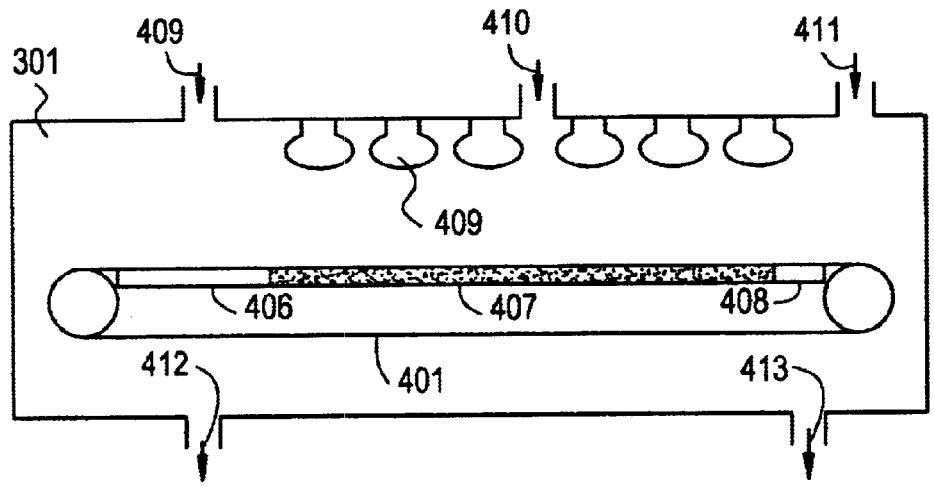

The internal construction of the chamber 301 is shown in FIGS. 4(A) and 4(B). The conveyor 401 which was made of heat resistant metal was established in the chamber 301 in such a way that the substrates could be heat treated while they were being moved. Furthermore, the heater 406, 407, 408 for heating the substrates 402 was established below the conveyor 401. The heater was constructed with three different zones, namely the part 406 where the temperature of the substrate was raised, the part 407 which was heated to a constant temperature and the cooling part 408. Moreover, the ultraviolet light source 409 was established over the part of the conveyor which was being heated to a constant temperature. A low pressure mercury lamp (center wavelength 246 nm and 185 nm) was used for the ultraviolet light source in this illustrative example.

Furthermore, the exhausting systems 412 and 413 for evacuating gas and the gas supply systems 409, 410 and 411 for supplying gas were established in the chamber 301. In this illustrative example, gas supply systems were established for each part so that an $N_2$ atmosphere was established in the parts 403 and 405 where the substrate was being heated up and cooled down and an $N_2O$ atmosphere was established in the part 404 where the substrate was being heated at a constant temperature and irradiated with ultraviolet light. Moreover, the exhausting systems 412 and 413 were established in the vicinities of the boundaries between these zones for evacuating the gases which had been introduced. Mixing of the gases in each zone was prevented by the establishment of the exhausting systems 412 and 413 in the boundary regions.

The operating process is outlined below. First of all a plurality of untreated substrates was set in a cassette and this was set in the standby chamber 302. In this illustrative example, two standby chambers for setting the untreated substrates and two standby chambers for setting the treated substrates were established, and this was done so that when carrying out a continuous process the substrates could be replaced without stopping the apparatus with a view to increasing the efficiency of the operation. Subsequently, the substrates were moved into the front chamber 304 by the transporting device 306 and, moreover, they were moved into the chamber 301 for heat treatment purposes and established on the conveyor 401. At this time the substrates 402 were arranged in two rows on the conveyor 401.

Figure 4C:
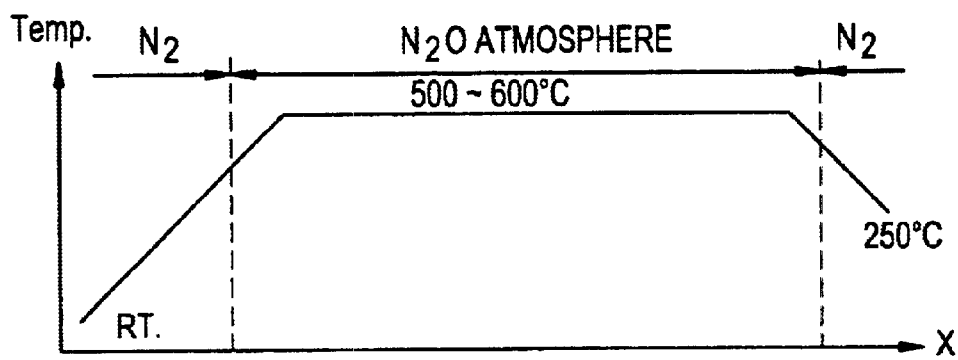

Then the substrates were moved into the heating process, and the temperature gradient along the conveyor 401 was as shown in FIG. 4(C). First of all the substrates were heated at a rate of 5–30° C./min, for example at 10° C./min, in the heating zone 403. At this time $N_2$ was being introduced from the gas supply system 409 and the heating was carried out in an $N_2$ atmosphere.

Subsequently, the substrates were moved into the zone 404 which was being heated to a constant temperature. The heat treatment was carried out here while the substrates were being irradiated with ultraviolet light from the ultraviolet light source which had been established over the conveyor. The heating temperature was 500–600° C., being set, for example, to 550° C. $N_2O$ gas was supplied from the gas supply system 410 at this time and an $N_2O$ atmosphere was provided. Furthermore, twenty substrates could be treated at the same time in the zone 404. Furthermore, the time required for one substrate to pass through this zone, which is to say the time required to heat treat one substrate, was from 30 minutes to 6 hours, and it is set, for example, to 3 hours.

After carrying out the heat treatment in this way, the substrate was cooled to 250° C. in the cooling zone 405. The cooling rate at this time was 5–30° C./min, the same as when heating, and it was set, for example, to 10° C./min. Moreover, $N_2$ was being introduced from the gas supply system 411 at this time and an $N_2$ atmosphere was provided.

Subsequently, the treated substrates were moved into the front chamber 305 by means of the transporting device 307 and then they were set in a cassette in the standby chamber 303 in which the substrates were held after treatment, and the substrate treatment process was completed.

Heat treatment in an $N_2O$ atmosphere with the conjoint use of ultraviolet irradiation was carried out in this way and, while the time required to treat one substrate in the apparatus shown in Example 1 was about 4 hours, it was about 10 minutes when the apparatus shown in this example was used, and the productivity was increased.

The heat treatment of this invention was carried out in the way described above. The results obtained on analysis using secondary ion mass spectroscopy (SIMS) were that the amount of nitrogen in the silicon oxide film, especially at the boundary with the silicon film, was increased as a result of the heat treatment carried out with the conjoint use of ultraviolet light, and it was observed that the carbon and hydrogen concentrations were reduced. This was the same effect as that obtained on carrying out heat treatment at 900° C. in an $N_2O$ atmosphere.

EXAMPLE 4

Figure 5:
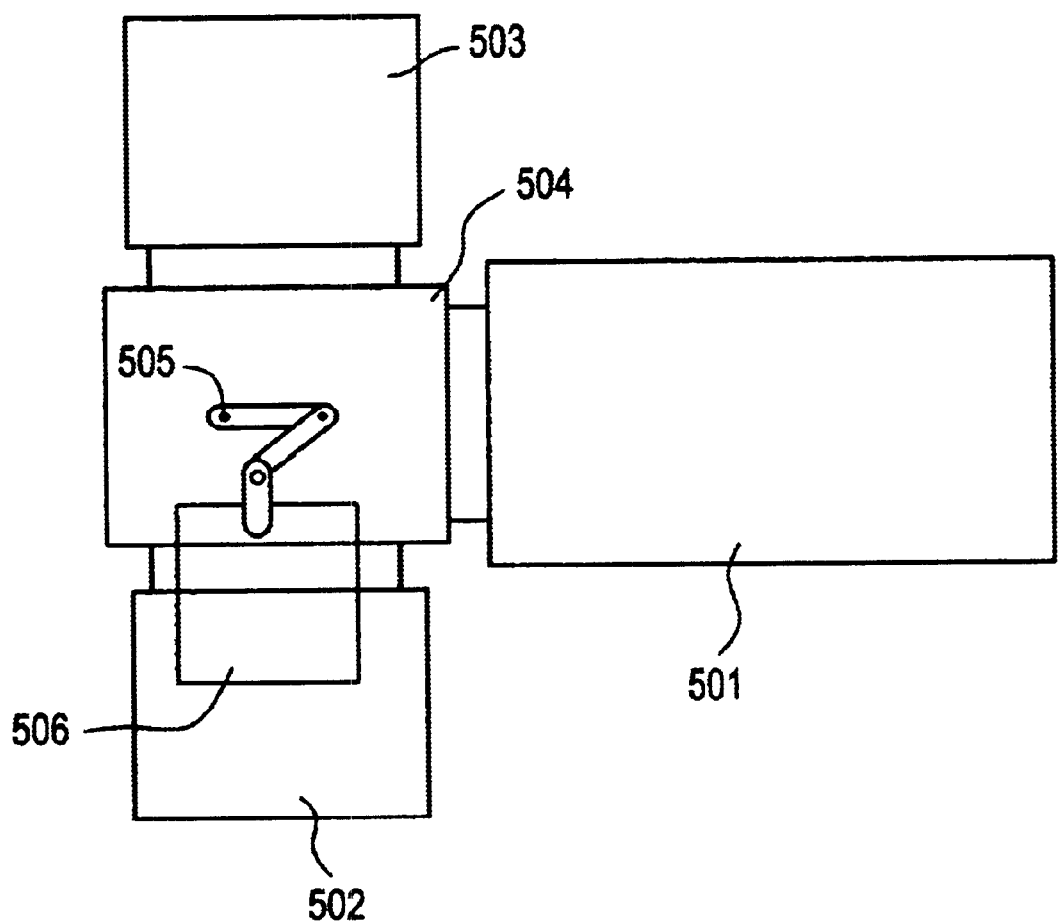
FIG. 5 shows heat treatment apparatus according to Examples 4 and 6.

This illustrative example is an example in which silicon oxide films which had been formed on a silicon film by means of the plasma CVD method using TEOS as the raw material were heat treated using the heat treatment apparatus shown in FIG. 5. The silicon oxide films used in this illustrative example were formed using method 1 for the silicon oxide film 705 (see FIG. 7(B)) in Illustrative Example 1.

As shown in FIG. 5, the heat treatment apparatus used in this illustrative example was constructed with the chamber 501 for carrying out the heat treatment, the standby chamber 502 in which the substrates were held before treatment, the standby chamber 503 in which the substrates were held after treatment and the front chamber 504 which was furnished with the transporting device 505, and the substrates 506 were moved between these chambers by means of the transporting device 505. Moreover, in this illustrative example the chamber 501 was of the batch type and heat treatment could be carried out while moving a plurality of substrates at the same time by means of a conveyor.

Figure 6A:
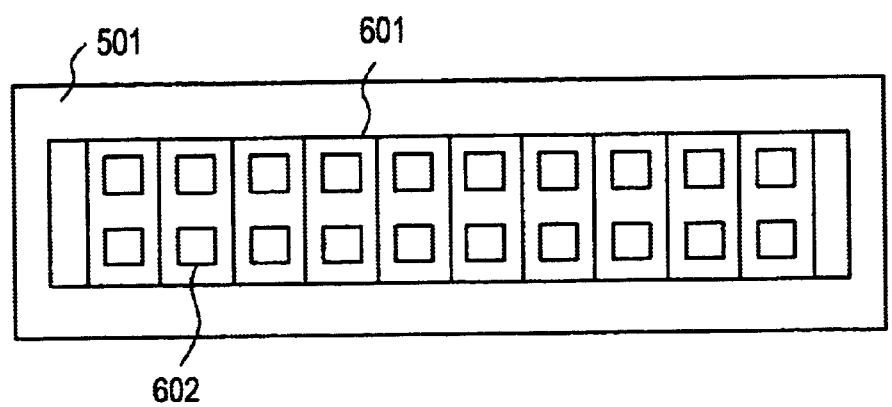
FIG. 6 shows the interior of the chamber of the heat treatment apparatus according to Examples 4 and 6 and the temperature gradients during heating.
Figure 6B:
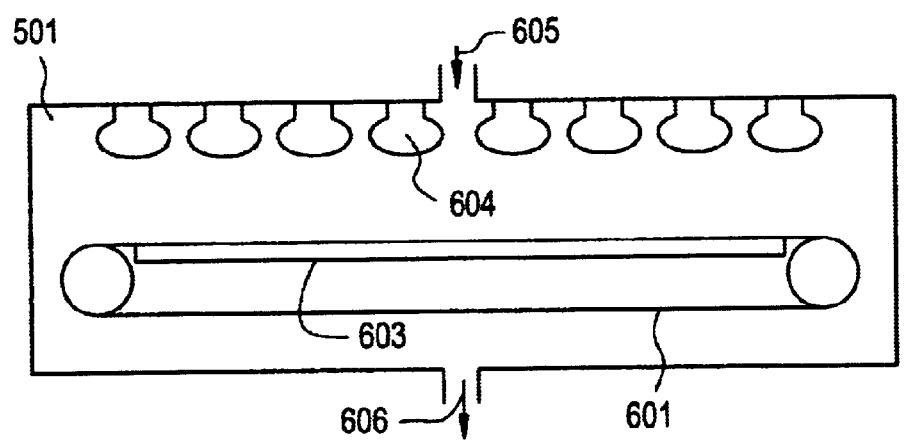

The construction of the interior of the chamber 501 is shown in FIGS. 6(A) and 6(B). The conveyor 601 which was made of a heat resistant metal was established in the chamber 501 for mounting the substrates 602. Furthermore, the heater 603 for heating the substrates was established below the conveyor 601. Moreover, the ultraviolet light source 604 was established above the conveyor 601.

Furthermore, the gas supply system 605 was established in the chamber 501 so as to provide an N$_2$ atmosphere when the substrates were being heated and cooled and to provide an N$_2$O atmosphere when they were being heated at a constant temperature. Moreover, the exhausting system 606 was established for exhausting the gas which had been introduced. Furthermore, the light source 605 was established for irradiating the substrates with ultraviolet light. A low pressure mercury lamp (center wavelength 246 nm and 185 nm) was used for the ultraviolet light source in this illustrative example.

The treatment operation is described below. The untreated substrates were set in the cassette for a plurality of substrates and this was set in the standby chamber 502. Then, a substrate was moved into the front chamber 504 by means of the transporting device 505 and, moreover, it was moved into the chamber 501 for heat treatment purposes and located on the conveyor 601. The substrate 602 was moved on the conveyor 601 at this time and the process was stopped when a total of twenty substrates had been established in two rows.

Figure 6C:
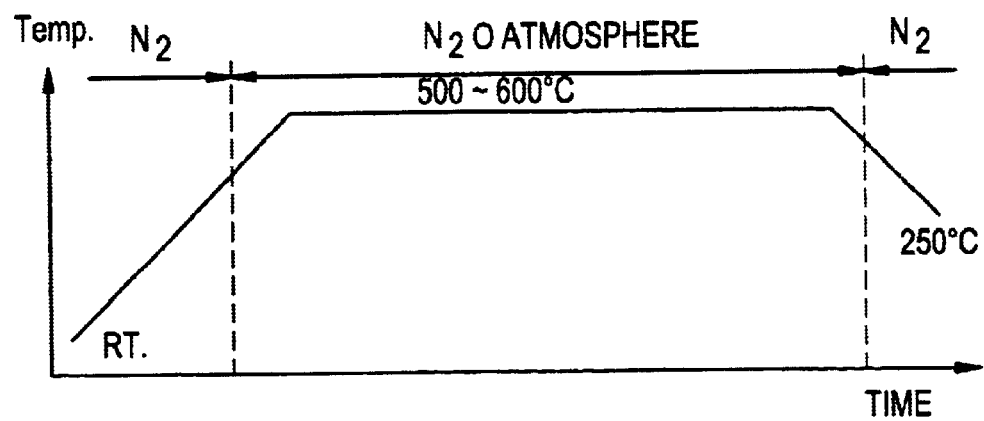
Figure 7A:
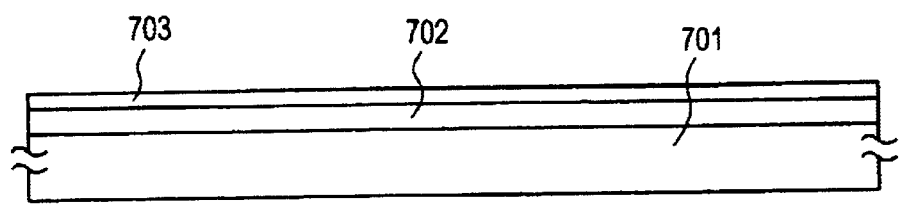
FIG. 7 shows the manufacturing process for the TFT of Example 1.
Figure 7B:
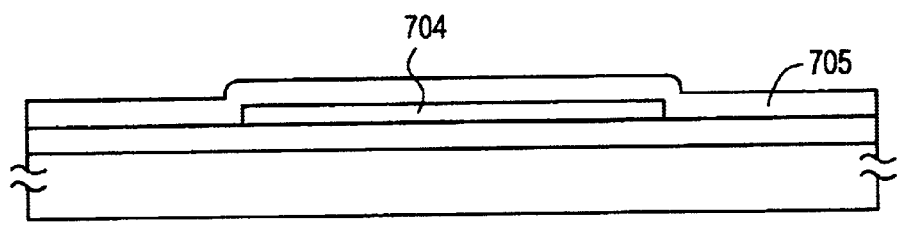
Figure 7C:
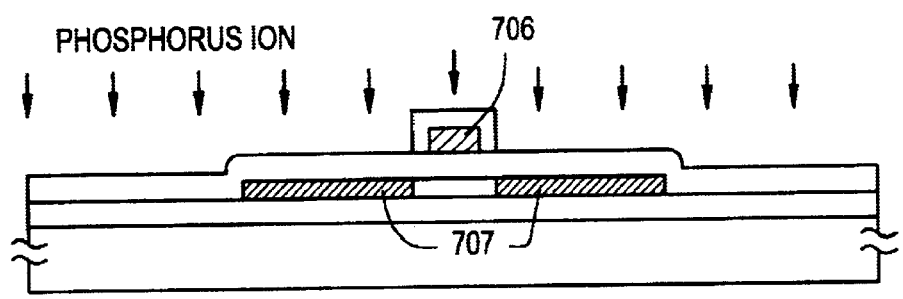
Figure 7D:
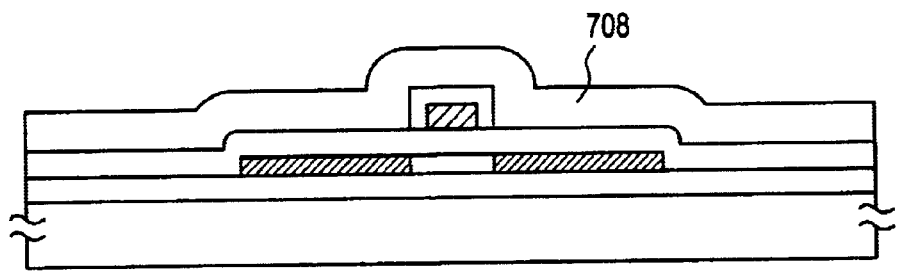
Figure 7E:
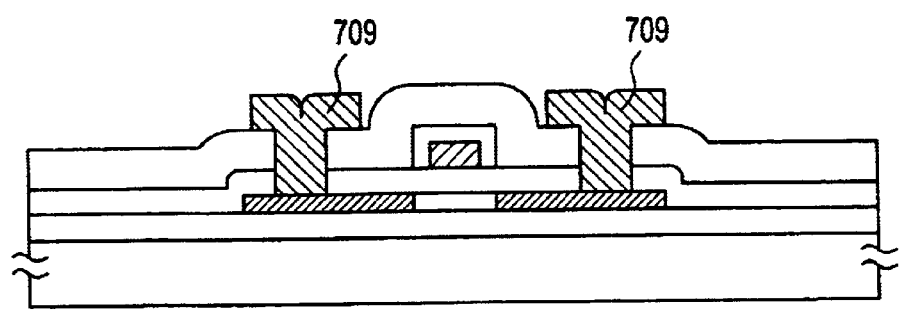

The way in which the temperature changed with time during the heat treatment is shown in FIG. 6(C). The substrates were heated at a rate of 5–30° C./min, for example at 10° C./min, while the temperature was being raised. N$_2$ gas was being introduced from the gas supply system 605 at this time and the heating was carried out in an N$_2$ atmosphere.

Subsequently, when the temperature at which the heat treatment was to be carried out was reached, ultraviolet light was irradiated from the ultraviolet light source 604 which was established above the conveyor 601. The heating temperature was 500–600° C., and heating was carried out, for example, to 550° C. At this time, N$_2$O gas was introduced by means of the gas supply system 605 immediately before the temperature at which the heat treatment was to be carried out had been reached and, when the temperature at which the heat treatment was to be carried out was reached, the situation was such that the heat treatment was carried out in a completely N$_2$O atmosphere. The heat treatment time was from 30 minutes to 6 hours, and it was set, for example, at 4 hours.

After carrying out the heat treatment in this way the substrates were cooled to 250° C. The cooling rate at this time was 5–30° C./min, the same as when heating, and it was set, for example, to 10° C./min. Moreover, N$_2$ was introduced from the gas supply system 605 at this time and an N$_2$ atmosphere was provided.

Subsequently, the treated substrates were moved into the front chamber 504 by means of the transporting device 505 and then they were set in a cassette in the standby chamber 503 in which the substrates were held after treatment, and the substrate treatment process was completed.

A heat treatment of this invention was carried out in this way. By means of the treatment described above, it was confirmed by means of secondary ion mass spectroscopy (SIMS) that a similar amount of nitrogen was contained in the silicon oxide film as that obtained on carrying out a heat treatment at 900° C. in an N$_2$O atmosphere.

EXAMPLE 5

This illustrative example is an example in which silicon oxide films which had been formed on silicon films by means of the low pressure CVD method with monosilane (SiH$_4$) and oxygen gas (O$_2$) as raw materials were heat treated using the heat treatment apparatus shown in FIG. 2.

The conditions for the formation of the silicon oxide films used in this illustrative example were substrate temperature 300–500° ° C. with a pressure within the chamber of 0.1–10 torr, these being set, for example to 400° C. and 1.5 torr.

First of all the substrates 203 were set around the inner wall of the chamber 201 in such a way as to surround the ultraviolet light source 204. Then, N$_2$ gas was introduced into the chamber 201 from the gas supply system and the interior of the chamber was displaced with N$_2$. At this time, gas was evacuated via the evacuating system 206, and a constant pressure was generally maintained within the chamber.

Next, after displacing the interior of the chamber with N$_2$, the heaters were heated and ultraviolet irradiation was carried out. At this time, the heating temperature was 300–700° C., and it was set, for example, to 500° C.

After heating the substrates to the prescribed temperature, the N$_2$ was replaced with N$_2$O and irradiation with ultraviolet light (center wavelength 246 nm and 185 nm) was carried out. At this time, the duration of the treatment was from 30 minutes to 6 hours, and heat treatment was carried out, for example, for 3 hours.

The silicon oxide films obtained on carrying out the abovementioned treatment were analyzed using secondary ion mass spectroscopy (SIMS), and it was observed that the amount of nitrogen had increased above the nitrogen concentration included in the silicon oxide film initially and that the amounts of carbon and hydrogen had been reduced, and that there was, in particular, an accumulation of nitrogen at the boundary with the silicon film.

EXAMPLE 6

This illustrative example is an example in which a silicon oxide film which has been formed with a plasma CVD method is modified by means of a heat treatment in an NH$_3$ atmosphere while being irradiated with ultraviolet light and in which an N-channel TFT is formed using this as the gate insulating film. The manufacturing process of the TFT in this example is shown in FIG. 7, and an outline of the apparatus used for the heat/ultraviolet irradiation treatment of the silicon oxide film mentioned above is shown in FIG. 1.

First of all, the silicon oxide film 702 base was formed with a thickness of 3000 Å using the plasma CVD method on the substrate 701. Then, an amorphous silicon film was formed with a thickness of 500 Å using the plasma CVD method. After this, a heat treatment was carried out in an N$_2$ atmosphere and the amorphous silicon film was crystallized. A trace amount of an element which promotes the crystallization of amorphous silicon, such as nickel for example, may be added in order to promote the crystallization of the amorphous silicon at this time. Furthermore, laser annealing may be used to improve crystallization. (FIG. 7(A))

Next, the crystallized silicon film 703 was etched and the island region 704 was formed. This island region 704 is the active layer of the TFT. The silicon oxide film 705 of thickness 1000 Å was then formed as a gate insulating film. In this illustrative example, the silicon oxide film was produced using the three different methods 1–3 indicated below. (FIG. 7(B))

In method 1, the film was formed with the plasma CVD method using TEOS as a raw material. The TEOS, which had been vaporized in a vaporizer, and oxygen were introduced into a chamber which had parallel plate-type electrodes, RF power (for example, frequency 13.56 MHz) was introduced and a plasma was formed, and the accumulation was carried out at a substrate temperature of 200–500°

C., and preferably of 250–400° C. In this illustrative example the reaction pressure was 4 Pa, the power input was 150 W and the substrate temperature was set at 350° C.

Method 2 was the sputter method. In this case synthetic quartz was used for the target and the film was formed by sputtering in a 100% oxygen atmosphere at a pressure of 1 Pa. The power input was 350 W and the substrate temperature was set at 200° C.

Method 3 was the ECR-CVD method, and oxygen and monosilane ($SiH_4$) were used as the raw material gases. Nitrogen oxides, such as $N_2O$, NO and $NO_2$ for example, could be used in place of the oxygen. Furthermore, the film-forming conditions at this time were a microwave power input (frequency 2.45 MHz) of 400 W without substrate heating.

Subsequently, heat treatments were carried out in an $NH_3$ atmosphere using the heat treatment apparatus shown in FIG. 1. As shown in FIG. 1, the heat treatment apparatus used in this illustrative example was constructed with the chamber 101 for carrying out the heat treatment, the standby chamber 102 in which the substrate was held before treatment, the standby chamber 103 in which the substrate was held after treatment and the front chamber 109 which was furnished with the transporting device 110, and the substrate 111 was moved between these chambers by means of the transporting device 110. Moreover, in this illustrative example a single plate-type system with which one plate was treated at a time was used in the chamber 101.

Furthermore, the chamber 101 had a substrate holder 104 which had a heater installed in the bottom for heating the substrate 105. Moreover, the ultraviolet light source 106 was established outside the chamber 101. A low pressure mercury lamp (center wavelength 246 nm and 185 nm) was used for the ultraviolet light source in this illustrative example. The top part of the chamber 101 to which the ultraviolet light source 106 was fitted was formed with a window of a material which did not absorb ultraviolet light, such as quartz for example, so that the ultraviolet light could enter the chamber. Moreover, in this illustrative example the ultraviolet light source was established outside the chamber, but it could have been established inside the chamber.

Furthermore, the exhausting system 108 for evacuating gas and the gas supply system 107 for introducing gas were established in the chamber 101 and the front chamber 109.

First of all, the untreated substrate was set in a multisubstrate cassette and this was set in the standby chamber 102. Then, the substrate was moved into the front chamber 109 by the transporting device 110 and the pressure in the front chamber was reduced by evacuation with the exhausting system, after which the substrate was moved into the chamber 101 for heat treatment purposes, in which the pressure had already been reduced, and located on the substrate holder 104.

Then, $NH_3$ gas was introduced into the chamber 101 via the gas supply system 107 and a heat treatment was carried out while irradiating with ultraviolet light in an essentially 100% $NH_3$ atmosphere with the pressure inside the chamber set to atmospheric pressure. At this time the heating temperature was 350–600° C., and it was set, for example, to 500° C. Furthermore, the treatment time was from 30 minutes to 6 hours, and heat treatment was carried out, for example, for 3 hours.

After carrying out the heat treatment in this way, the treated substrate was moved to the front chamber 109 by the transporting device 110 and then it was set in the cassette in the standby chamber 103 in which the substrates were held after treatment, and the treatment process of one substrate was completed. This same process was then carried out repeatedly.

The heat treatment of the present invention was carried out in the way outlined above and, as a result, an effect similar to that obtained on carrying out a heat treatment at 900° C. in an $NH_3$ atmosphere was obtained by means of a heat treatment at 500° C.

Next, the samples which had been heat treated with the conjoint use of ultraviolet light were analyzed using secondary ion mass spectrometry (SIMS) and the results obtained confirmed that, in the silicon oxide film, and especially in the silicon oxide film which had been prepared using the method 1 (the plasma CVD method with TEOS) described above, the amount of nitrogen (N) at the boundary with the silicon film was increased. Furthermore, the same was found with the silicon oxide films which had been formed using method 2 (the sputter method) and method 3 (the ECR-CVD method). Silicon oxide films which have such a composition are preferred as gate insulating films.

No change was observed in the nitrogen concentration when silicon oxide films which had been formed using the methods 1–3 described above were heated in the apparatus shown in FIG. 1 under the same temperature conditions in an atmosphere of nitrogen instead of $NH_3$ for comparison.

Subsequently, an aluminum (containing 1 wt % Si or 0.1–0.3 wt % Sc) film of thickness 5000 Å was formed by means of the sputtering method and this was etched to form the gate electrode 706. Then, the substrate was immersed in an ethylene glycol solution of 1–3% tartaric acid which had been adjusted to pH about 7 with ammonia and anodic oxidation was carried out using a platinum cathode and the aluminum gate electrode for the anode. The anodic oxidation was completed by raising the voltage up to 120 V at the initial fixed current and maintaining this condition for 1 hour. An anodic oxide of thickness 1500 Å was formed in this way.

After this, an impurity (phosphorus in this case) was implanted into the island-like silicon film 704 with the ion doping method, with self-arrangement, using the gate electrode 706 as a mask. The extent of doping in this case was $1 \times 10^{14} - 5 \times 10^{15}$ atom/cm$^2$, the accelerating voltage was 10–90 kV and, for example, the extent of doping was set to $1 \times 10^{15}$ atom/cm$^2$ and the accelerating voltage was set to 80 kV. The N-type impurity regions 707 were formed as a result of this procedure. (FIG. 7(C))

Moreover, activation of the doped impurity regions 707 was carried out by irradiation with a KrF excimer laser (wavelength 248 nm, pulse width 20 nsec). The appropriate energy density of the laser was 200–400 mJ/cm$^2$, and preferably 250–300 mJ/cm$^2$. This process could also have been carried out by means of a heat treatment.

Next, a silicon oxide film of thickness 4000 Å was formed by means of plasma. CVD for the interlayer insulating film 708. (FIG. 7(D))

Then, the interlayer insulating film 708 and the gate insulating film 705 were etched and source/drain contact holes were formed. Subsequently, an aluminum film was formed by means of the sputtering method, patterning was carried out, the source/drain electrodes 709 were formed and the N-channel-type TFT was completed.

The deterioration of the TFT produced in this illustrative example was evaluated. The TFT manufacturing process was always the same except that the method of preparing the gate insulating film (any of the methods 1–3) and the method of heat treating the gate insulating film ($NH_3$ atmosphere/ ultraviolet light irradiation/500° C./3 hours (the abovementioned conditions are denoted by "NH$_3$ atmosphere") or N$_2$ atmosphere/no ultraviolet light irradiation/500° C./3 hours (the abovementioned conditions are denoted by "N$_2$ atmosphere,")) were varied as indicated in the table below. The TFT obtained were set to a drain voltage of +14 V, the gate voltage was varied from −17 V to +17 V and the drain current was measured. The measurement was made ten times, the electric field effect mobility $\mu_{10}$ obtained by measurement on the tenth occasion was compared with the electric field effect mobility $\mu_o$ obtained on the initial measurement, and the value $1-(\mu_{10}/\mu_o)$ was defined as the deterioration factor. The results obtained are shown in the table below. (A minus sign for the deterioration factor signifies that the mobility had increased.)

| Sample | Film Forming Method | Heat Treatment | Deteriorating Factor |
|---|---|---|---|
| A-1 | No.1 (Plasma CVD with TEOS) | NH$_3$ atmosphere | 4.3% |
| A-2 | No.1 (plasma CVD with TEOS) | N$_2$ atmosphere | 50.6% |
| B-1 | No.2 (Sputter method) | NH$_3$ atmosphere | −0.8% |
| B-2 | No.2 (Sputter method) | N$_2$ atmosphere | 12.5% |
| C-1 | No.3 (ECR-CVD method) | NH$_3$ atmosphere | 1.2% |
| C-2 | No.3 (ECR-CVD method) | N$_2$ atmosphere | 21.6% |

With all of the samples it is clear that the deterioration factor was greatly reduced by irradiating with ultraviolet light when carrying out the heat treatment in an NH$_3$ atmosphere of this present invention. Furthermore, it was also clear from a similar experiment that no improvement was seen in the deterioration factor if there was no irradiation with ultraviolet light when carrying out the heat treatment in an NH$_3$ atmosphere.

The TFT which had been produced in this illustrative example had good durability and little deterioration even though a silicon oxide film which had been prepared using a PVD method or CVD method was being used for the gate insulating film, and TFT which had excellent characteristics were obtained. This is due to the fact that the unpaired bonds and the Si—H and Si—OH bonds had been converted to nitride and the amount of nitrogen in the silicon oxide film had been increased by the heat treatment with the conjoint use of ultraviolet light irradiation carried out in an NH$_3$ atmosphere in accordance with the present invention.

EXAMPLE 7

This illustrative example is an example in which silicon oxide films which have been formed on a silicon film by means of the plasma CVD method with TEOS as the raw material are heat treated using the heat treatment apparatus shown in FIG. 2. The silicon oxide films used in this illustrative example were formed using method 1 for the silicon oxide film 705 of Illustrative Example 1 (see FIG. 7(B)).

As shown in FIG. 2, the heat treatment apparatus used in this illustrative example was different from the single plate chamber shown in Example 6, and in this case it was constructed with just a chamber for carrying out the heat treatment and it provided a batch system with which a plurality of sheets could be treated at the same time.

The chamber 201 in this illustrative example was cylindrical in shape, and it was such that the substrates 203 could be arranged around the inner wall. Moreover, the substrates could be heated by the heaters 202 which were established around the circumference of the chamber 201. Moreover, the ultraviolet light source 204 is established in the middle of the chamber 201 in such a way that ultraviolet light is irradiated equally onto all of the substrates. A low pressure mercury lamp (center wavelength 246 nm and 185 nm) was used for the ultraviolet light source in this illustrative example.

Furthermore, the exhausting system 206 for carrying out evacuation and the gas supply system 205 for introducing gas were established in the chamber.

An example of treatment using this apparatus will now be described. The substrates 203 were set around the inner wall of the chamber 201 in such a way as to surround the ultraviolet light source 204. Then, N$_2$ gas was introduced into the chamber 201 from the gas supply system and the interior of the chamber was displaced with N$_2$. At this time, gas was evacuated via the exhausting system 206, and a constant pressure was generally maintained within the chamber.

Next, after displacing the interior of the chamber with N$_2$, the heaters were heated and ultraviolet irradiation was started. At this time the heating temperature was 300–700° C., and it was set, for example, to 500° C.

After heating the substrates to the prescribed temperature, the N$_2$ was replaced with N$_2$H$_4$ and irradiation with ultraviolet light was carried out. At this time, the duration of the treatment was from 30 minutes to 6 hours, and it was carried out, for example, for 4 hours.

The silicon oxide films obtained on carrying out the abovementioned treatment were analyzed using secondary ion mass spectroscopy (SIMS) and it was observed that the amount of nitrogen had increased above the nitrogen concentration included in the silicon oxide film initially and that there was, in particular, an accumulation of nitrogen at the boundary with the silicon film.

EXAMPLE 8

This illustrative example is an example in which silicon oxide films which had been formed on a silicon film by means of the sputter method in a 100% oxygen atmosphere using synthetic quartz for the target are heat treated using the heat treatment apparatus shown in FIG. 3. The silicon oxide films used in this illustrative example were formed by method 2 for the silicon oxide film 705 (see FIG. 7(B)) of Illustrative Example 1.

As shown in FIG. 3, the heat treatment apparatus used in this illustrative example was constructed with the chamber 301 for carrying out heat treatment, the standby chamber 301 in which the substrates were held before treatment, the standby chamber 303 in which the substrates were held after treatment and the front chambers 304 and 305 which were furnished with the transporting devices 306 and 307, and the substrates 308 and 309 were moved between these chambers by means of the transporting devices 306 and 307. Moreover, in this illustrative example the chamber for carrying out the heat treatment was of the batch type in which heat treatment could be carried out while moving a plurality of substrates at the same time by means of a conveyor.

Figure 10A:
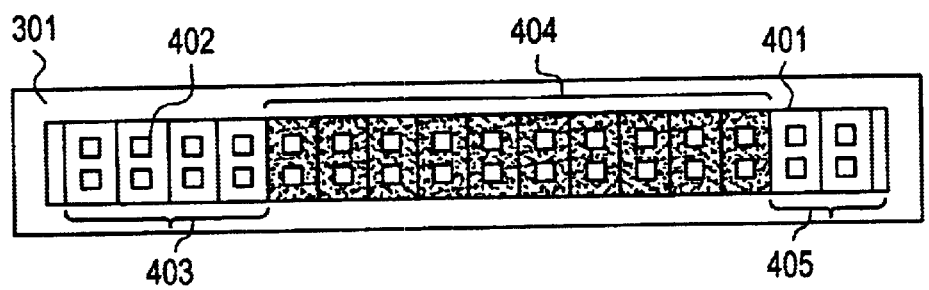
FIG. 10 shows the interior of the chamber of the heat treatment apparatus according to Example 8 and the temperature gradient during heating.
Figure 10B:
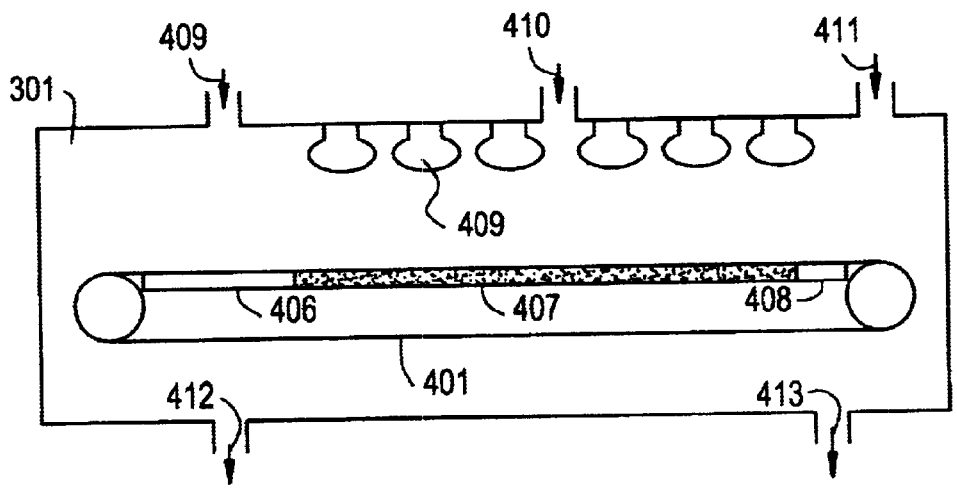

The internal construction of the chamber 301 is shown in FIGS. 10(A) and 10(B). The conveyor 401 which was made of heat resistant metal was established in the chamber 301 in such a way that the substrates could be heat treated while they were being moved. Furthermore, the heater 406, 407, 408 for heating the substrates 402 was established below the conveyor 401. The heater was constructed with three different zones, namely the part 406 where the temperature of the substrates was raised, the part 407 which was heated to a constant temperature, and the cooling part 408. Moreover, the ultraviolet light source 409 was established over the part of the conveyor which was being heated to a constant temperature. A low pressure mercury lamp (center wavelength 246 nm and 185 nm) was used for the ultraviolet light source in this illustrative example.

Furthermore, the exhausting systems 412 and 413 for evacuating gas, and the gas supply systems 409, 410 and 411 for supplying gas, were established in the chamber 301. In this illustrative example, gas supply systems were established for each part so that an $N_2$ atmosphere was established in the parts 403 and 405 where the substrate was being heated up and cooled down and an $NH_3$ atmosphere was established in the part 404 where the substrate was being heated at a constant temperature while being irradiated with ultraviolet light. Moreover, the exhausting systems 412 and 413 were established in the vicinities of the boundaries between these zones for evacuating the gases which had been introduced. Mixing of the gases in each zone was prevented by the establishment of the exhausting systems 412 and 413 in the boundary regions.

The operating process is outlined below. First of all, a plurality of untreated substrates was set in a cassette and this was set in the standby chamber 302. In this illustrative example, two standby chambers for setting the untreated substrates and two standby chambers for setting the treated substrates were established, and this was done so that when carrying out a continuous process the substrates could be replaced without stopping the apparatus with a view to increasing the efficiency of the operation. Subsequently, the substrates were moved into the front chamber 304 by the transporting device 306 and, moreover, they were moved into the chamber 301 for heat treatment purposes and established on the conveyor 401. At this time the substrates 402 were arranged in two rows on the conveyor 401.

Figure 10C:
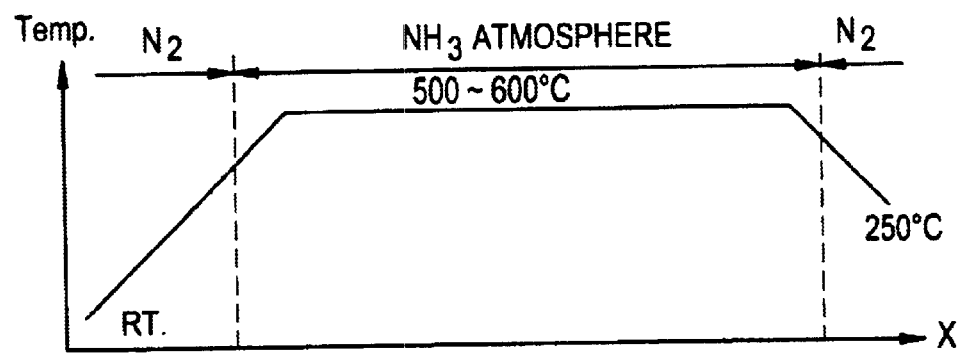

Then, they were moved into the heating process and the temperature gradient along the conveyor 401 was as shown in FIG. 10(C). First of all the substrates were heated at a rate of 5–30° C./min, for example at a rate of 10° C./min, in the heating zone 403. At this time $N_2$ was being introduced from the gas supply system 409 and the heating was carried out in an $N_2$ atmosphere.

Subsequently, the substrates were moved into the zone 404 which was being heated to a constant temperature. The heat treatment was carried out here while irradiating with ultraviolet light from the ultraviolet light source which had been established over the conveyor. The heating temperature was 500–600° C., being set, for example, to 550° C. $NH_3$ gas was supplied from the gas supply system 410 at this time and an $NH_3$ atmosphere was provided. Moreover, twenty substrates could be treated at the same time in the zone 404. Furthermore, the time required for one substrate to pass through this zone, which is to say the time required to heat treat one substrate, was from 30 minutes to 6 hours, and it was set, for example, to 3 hours.

After carrying out heat treatment in this way, the substrates were cooled to 250° C. in the cooling zone 405. The cooling rate at this time was 5–30° C./min, the same as when heating, and it was set, for example, to 10° C./min. Moreover, $N_2$ was being introduced from the gas supply system 411 at this time and an $N_2$ atmosphere was provided.

Subsequently, the treated substrates were moved into the front chamber 305 by means of the transporting device 307 and then set in a cassette in the standby chamber 303 in which the substrates were held after treatment, and the substrate treatment process was completed.

Heat treatment in an $NH_3$ atmosphere with the conjoint use of ultraviolet irradiation was carried out in this way, and while the time required to treat one substrate in the apparatus shown in Example 1 was about 4 hours, it was about 10 minutes when the apparatus shown in this illustrative example was used and the productivity was increased.

The heat treatment of this invention was carried out in the way described above. The result obtained on analysis using secondary ion mass spectroscopy (SIMS) showed that the amount of nitrogen in the silicon oxide film, especially at the boundary with the silicon film, was increased. This was the same effect as that obtained on heat treating at 900° C. in an $NH_3$ atmosphere.

EXAMPLE 9

This illustrative example is an example in which silicon oxide films which had been formed on a silicon film by means of the ECR-CVD method using monosilane ($SiH_4$) and oxygen as the raw material gases are heat treated using the heat treatment apparatus shown in FIG. 5. The silicon oxide films used in this illustrative example were formed by means of method 3 for the silicon oxide film 705 (see FIG. 7(B)) of Illustrative Example 1.

As shown in FIG. 5, the heat treatment apparatus used in this illustrative example was constructed with the chamber 501 for carrying out the heat treatment, the standby chamber 502 in which the substrates were held before treatment, the standby chamber 503 in which the substrates were held after treatment and the front chamber 504 which was furnished with the transporting device 505, and the substrates 506 were moved between these chambers by means of the transporting device 505. Moreover, in this illustrative example the chamber 501 was of the batch type and heat treatment could be carried out while moving a plurality of substrates at the same time by means of a conveyor.

Figure 11A:
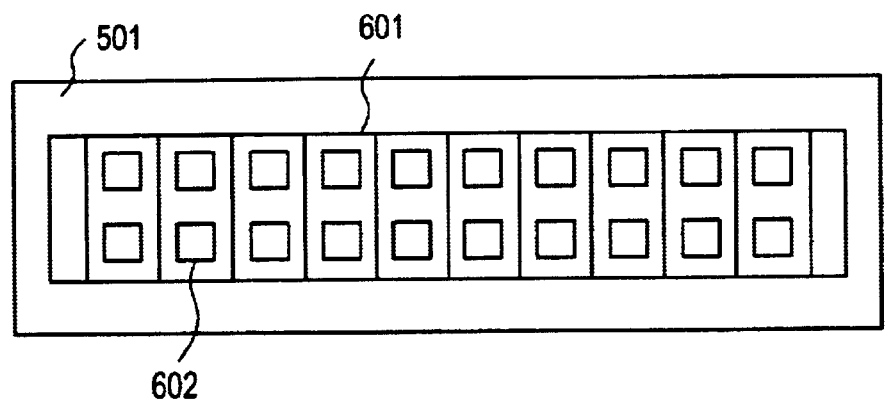
FIG. 11 shows the interior of the chamber of the heat treatment apparatus according to Examples 9 and 10 and the temperature gradients during heating.
Figure 11B:
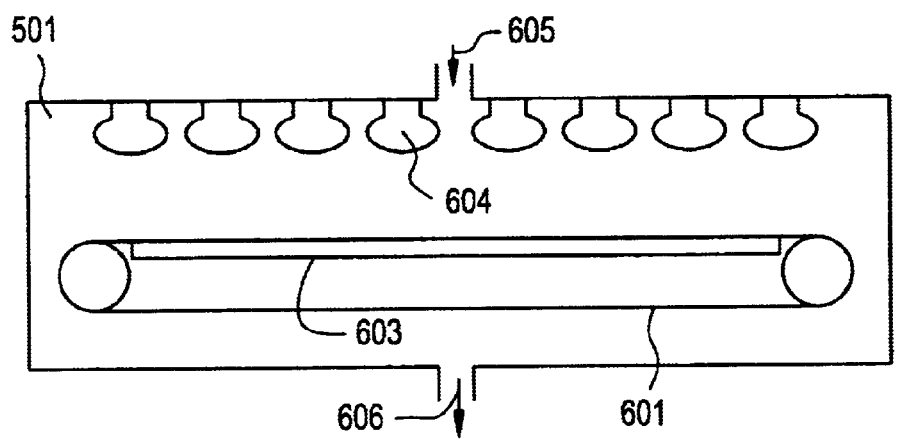

The construction of the interior of the chamber 501 is shown in FIGS. 11(A) and 11(B). The conveyor 601 which was made of a heat resistant metal was established in the chamber 501 for mounting the substrates 602. Furthermore, the heater 603 for heating the substrates was established below the conveyor 601. Moreover, the ultraviolet light source 604 was established above the conveyor 601. A low pressure mercury lamp (center wavelength 246 nm, 185 nm) was used for the ultraviolet light source in this illustrative example.

Furthermore, the gas supply system 605 was established in the chamber 501 so as to provide an $N_2$ atmosphere when the substrates were being heated and cooled and to provide an $N_2H_4$ atmosphere when they were being heated at a constant temperature. Moreover, the exhausting system 606 was established for evacuating the gas which had been introduced. Furthermore, the light source 605 is established to irradiate the substrates with ultraviolet light.

The treatment operation is described below. The untreated substrates were set in the cassette for a plurality of substrates and this was set in the standby chamber 502. Then, a substrate was moved into the front chamber 504 by means of the transporting device 505 and, moreover, it was moved into the chamber 501 for heat treatment purposes and located on the conveyor 601. The substrate 602 was moved on the conveyor 601 at this time and the process was stopped when a total of twenty substrates had been established in two rows.

Figure 11C:
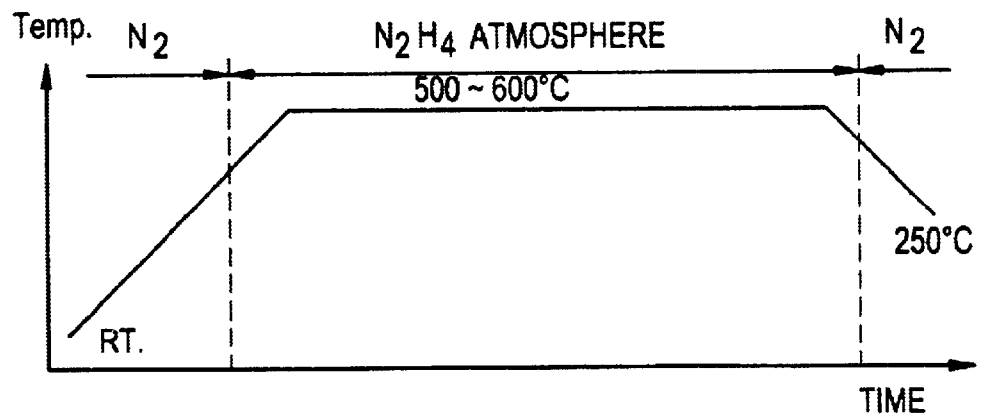

The way in which the temperature changed with time during heat treatment is shown in FIG. 11(C). The substrates were heated at a rate of 5–30° C./min, for example at a rate of 10° C./min, during the warming period. $N_2$ gas was being introduced from the gas supply system 605 at this time and the heating was carried out in an $N_2$ atmosphere.

Subsequently, when the temperature at which the heat treatment was to be carried out was reached, ultraviolet light was irradiated from the ultraviolet light source 604 which was established above the conveyor 601. The heating temperature was 500–600° C., and heating was carried out, for example, at 550° C. At this time, $N_2H_4$ gas was introduced by means of the gas supply system 605 immediately before the temperature at which the heat treatment was to be carried out had been reached, and when the temperature at which the heat treatment was to be carried out was reached the situation was such that the heat treatment was carried out in a completely $N_2H_4$ atmosphere. The heat treatment time was from 30 minutes to 6 hours, and it was set, for example, to 4 hours.

After carrying out the heat treatment in this way the substrates were cooled to 250° C. The cooling rate at this time was 5–30° C./min, the same as when heating, and it was set, for example, to 10° C./min. Moreover, $N_2$ was introduced from the gas supply system 605 at this time and the cooling was carried out in an $N_2$ atmosphere.

Subsequently, the treated substrates were moved into the front chamber 504 by means of the transporting device 505 and then they were set in the cassette in the standby chamber 503 in which the substrates were held after treatment, and the substrate treatment, process was completed.

A heat treatment of this invention was carried out in this way. By means of the treatment described above, it was confirmed by means of secondary ion mass spectroscopy (SIMS) that a similar amount of nitrogen was contained in the silicon oxide film as that obtained on carrying out a heat treatment at 900° C. in an $N_2H_4$ atmosphere.

EXAMPLE 10

This illustrative example is an example in which silicon oxide films which had been formed on silicon films by means of the low pressure CVD method with monosilane ($SiH_4$) and oxygen gas ($O_2$) as raw materials are heat treated using the heat treatment apparatus shown in FIG. 5. The conditions for the formation of the silicon oxide film used in this illustrative example were substrate temperature 300–500° C. with a pressure within the chamber of 0.1–10 torr, these being set, for example to 400° C. and 1.5 torr.

First of all, the untreated substrates were set in the cassette which held a plurality of substrates and this was set in the standby chamber 502. Then, a substrate was moved into the front chamber 504 by means of the transporting device 505 and then it was moved into the chamber 501 for heat treatment purposes and located on the conveyor 601.

The way in which the temperature changed with time during heat treatment is shown in FIG. 11(C). The substrates were heated at a rate of 5–30° C./min, for example at a rate of 10° C./min, during the warming period. $N_2$ gas was being introduced from the gas supply system 605 at this time and the heating was carried out in an $N_2$ atmosphere.

Subsequently, when the temperature at,which the heat treatment was to be carried out was reached, ultraviolet light was irradiated from the ultraviolet light source 604 (center wavelength 246 nm, 185 nm) which was established above the conveyor 601. The heating temperature was 500–600° C., and heating was carried out, for example, to 550° C. At this time $N_2H_4$ gas was introduced by means of the gas supply system 605 immediately before the temperature at which the heat treatment was to be carried out had been reached, and when the temperature at which the heat treatment was to be carried out was reached the situation was such that the heat treatment was carried out in a completely $N_2H_4$ atmosphere. The heat treatment time was from 30 minutes to 6 hours, and it was set, for example, to 3 hours.

After carrying out the heat treatment in this way, the substrates were cooled to 250° C. The cooling rate at this time was 5–30° C./min, the same as when heating, and it was set, for example, to 10° C./min. Moreover, $N_2$ was introduced from the gas supply system 605 at this time and the cooling was carried out in an $N_2$ atmosphere.

Subsequently, the treated substrates were moved into the front chamber 504 by means of the transporting device 505 and then they were set in a cassette in the standby chamber 503 in which the substrates were held after treatment, and the substrate treatment process was completed.

A heat treatment of this invention was carried out in this way. By means of the treatment described above, it was confirmed by means of secondary ion mass spectroscopy (SIMS) that a similar amount of nitrogen was contained in the silicon oxide film to that obtained on carrying out a heat treatment at 900° C. in an $N_2H_4$ atmosphere.

EXAMPLE 11

This illustrative example provides an example in which the third and fourth inventions are executed. That is to say, it is an example in which a silicon oxide film was heat treated in an $N_2O$ atmosphere while being irradiated with ultraviolet light, and then the film quality was improved by carrying out a heat treatment in a hydrogen nitride atmosphere (an ammonia atmosphere in this illustrative example), and an N-channel-type TFT was formed using this as a gate insulation film, and an example in which a silicon oxide film was heat treated in a hydrogen nitride atmosphere (an ammonia atmosphere in this illustrative example) while being irradiated with ultraviolet light, and then the film quality was improved by carrying out a heat treatment in an $N_2O$ atmosphere, and an N-channel-type TFT was formed using this as a gate insulation film. Furthermore, an outline of the apparatus which was used for the abovementioned heat/ultraviolet light irradiation treatment is shown in FIG. 1.

First of all, the silicon oxide film 702 base was formed with a thickness of 3000 Å using the plasma CVD method on the substrate 701. Then, an amorphous silicon film was formed with a thickness of 500 Å using the plasma CVD method. After this, a heat treatment was carried out in an $N_2$ atmosphere and the amorphous silicon film was crystallized. A trace amount of an element which promotes the crystallization of amorphous silicon, such as nickel for example, may be added in order to promote the crystallization of the amorphous silicon at this time. Furthermore, laser annealing may be used to improve crystallization. (FIG. 7(A))

Next, the crystallized silicon film 703 was etched and the island region 704 was formed. This island-like region is the active layer of the TFT. The silicon oxide film 705 of thickness 1000 Å was then formed as a gate insulating film. In this illustrative example, the silicon oxide film was produced using the three different methods 1–3 indicated below. (FIG. 7(B))

In method 1, the film was formed with the plasma CVD method using TEOS as a raw material. The TEOS which had been vaporized in a vaporizer and oxygen were introduced into a chamber which had parallel plate-type electrodes, RF power (for example, frequency 13.56 MHz) was introduced and a plasma was formed, and the accumulation was carried out at a substrate temperature of 200–500° C., and preferably of 250–400° C. In this illustrative example the reaction pressure was 4 Pa, the power input was 150 W and the substrate temperature was set at 350° C.

Method 2 was the sputter method. In this case synthetic quartz was used for the target and the film was formed by sputtering in a 100% oxygen atmosphere at a pressure of 1 Pa. The power input was 350 W and the substrate temperature was set at 200° C.

Method 3 was the ECR-CVD method, and oxygen and monosilane ($SiH_4$) were used as the raw material gases. Nitrogen oxides, such as $N_2O$, NO and $NO_2$ for example, could be used in place of the oxygen. Furthermore, the film-forming conditions at this time were a microwave power input (frequency 2.45 MHz) of 400 W without substrate heating.

Subsequently, the silicon oxide films which had been formed in these ways were subjected to a heat treatment of the third or fourth invention. As shown in FIG. 1, the heat treatment apparatus used in this illustrative example was constructed with the chamber 101 for carrying out the heat treatment, the standby chamber 102 in which the substrate was held before treatment, the standby chamber 103 in which the substrate was held after treatment and the front chamber 109 which was furnished with the transporting device 110, and the substrate 111 was moved between these chambers by means of the transporting device 110. Moreover, in this illustrative example a single substrate-type system with which one substrate was treated at a time was used in the chamber 101.

Furthermore, the chamber 101 had a substrate holder 104 which had a heater installed in the bottom for heating the substrate 105. Moreover, the ultraviolet light source 106 was established outside the chamber 101. A low pressure mercury lamp (center wavelength 246 nm and 185 nm) was used for the ultraviolet light source in this illustrative example. The top part of the chamber 101 to which the ultraviolet light source 106 was fitted was formed with a window of a material which did not absorb ultraviolet light, such as quartz for example, so that the ultraviolet light could enter the chamber. Moreover, in this illustrative example the ultraviolet light source was established outside the chamber, but it could have been established inside the chamber.

Furthermore, the exhausting system 108 for exhausting the gases and the gas supply system 107 for introducing the gases were established in the chamber 101 and the front chamber 109.

A heat treatment of the third invention is described first of all below. First of all, the untreated substrate was set in a multisubstrate cassette and this was set in the standby chamber 102. Then, a substrate was moved into the front chamber 109 by the transporting device 110 and the pressure in the front chamber was reduced by evacuation with the exhausting system, after which the substrate was moved into the chamber 101 for heat treatment purposes, in which the pressure had already been reduced, and placed on the substrate holder 104.

Then, $N_2O$ gas was introduced into the chamber 101 via the gas supply system 107 and a heat treatment was carried out while irradiating with ultraviolet light in an essentially 100% $N_2O$ atmosphere with the pressure inside the chamber set to atmospheric pressure. At this time, the heating temperature was 350–600° C., and it was set, for example, to 500° C. Furthermore, the treatment time was from 30 minutes to 6 hours, and heat treatment was carried out for, for example, 3 hours.

Subsequently, the $N_2O$ was evacuated from the chamber and $NH_3$ was introduced. At this time, the introduction of the $NH_3$ was carried out after evacuation of the $N_2O$ had been carried out satisfactorily and it was at a low concentration. $NH_3$ was introduced in this way and a heat treatment was carried out while irradiating with ultraviolet light in an essentially 100% $NH_3$ atmosphere with the pressure inside the chamber set to atmospheric pressure. At this time, the heating temperature was 500° C. and the heat treatment was carried out for 3 hours.

After carrying out the two heat treatments in this way, the treated substrate was moved to the front chamber 109 by the transporting device 110 and then it was set in the cassette in the standby chamber 103 in which the substrates were held after treatment, and the treatment process for one substrate was completed. This same process was then carried out repeatedly. The heat treatment of the third invention was carried out in the way indicated above.

On the other hand, three types of silicon oxide film which had been prepared in the same way were subjected to a heat treatment of the fourth invention.

First of all $NH_3$ gas was introduced into the chamber 101 via the gas supply system 107 and a heat treatment was carried out while irradiating with ultraviolet light in an essentially 100% $NH_3$ atmosphere with the pressure inside the chamber set to atmospheric pressure. At this time the heating temperature was 500° C. Furthermore, the heat treatment was carried out for a treatment time of 3 hours.

Subsequently, the $NH_3$ was evacuated from the chamber and $N_2O$ was introduced. At this time the introduction of the $N_2O$ was carried out after evacuation of the $NH_3$ had been carried out satisfactorily and it was at a low concentration. $N_2O$ was introduced in this way and a heat treatment was carried out while irradiating with ultraviolet light in an essentially 100% $N_2O$ atmosphere with the pressure inside the chamber set to atmospheric pressure. At this time the heating temperature was 500° C. and the heat treatment was carried out for a treatment time of 3 hours.

After carrying out the two heat treatments in this way, the treated substrate was moved to the front chamber 109 by the transporting device 110 and then it was set in the cassette in the standby chamber 103 in which the substrates were held after treatment, and the treatment process for one substrate was completed. This same process was then carried out repeatedly. The heat treatment of the fourth invention was carried out in the way indicated above.

The silicon oxide films which had been prepared using the three types of film-forming method as described above were each subjected to the two types of heat treatments, the six types of sample which had been heat treated with the conjoint use of ultraviolet light were analyzed using the secondary ion mass spectrometry (SIMS) and the results obtained confirmed that, in the silicon oxide film, and especially in the silicon oxide film which had been prepared using the method 1 (the plasma CVD method with TEOS) described above, the amount of carbon (C) at the boundary with the silicon film had fallen and the amount of nitrogen (N) had increased. Furthermore, it was confirmed that the hydrogen (H) had fallen at the same time. In the same way it was confirmed that there was also an increase in the nitrogen concentration at the silicon/silicon oxide boundary in the silicon oxide films which had been formed using method 2 (the sputter method) and method 3 (the ECR-CVD method). Silicon oxide films which have such a composition are preferred as gate insulating films.

No change was observed in the nitrogen, hydrogen and carbon concentrations when the silicon oxide films which had been formed using the methods 1–3 described above were heated in the apparatus shown in FIG. 1 under the same temperature conditions in an atmosphere of nitrogen instead of $N_2O$ or $NH_3$ for comparison.

Subsequently, an aluminum (containing 1 wt % Si or 0.1–0.3 wt % Sc) film of thickness 5000 Å was formed by means of the sputtering method and this was etched to form the gate electrode 706. Then, the substrate was immersed in an ethylene glycol solution of 1–3% tartaric acid which had been adjusted to pH about 7 with ammonia and anodic oxidation was carried out using a platinum cathode and the aluminum gate electrode for the anode. The anodic oxidation was completed by raising the voltage up to 120 V at the initial fixed current and maintaining this condition for 1 hour. An anodic oxide of thickness 1500 Å was formed in this way.

After this, an impurity (phosphorus in this case) was implanted into the island-like silicon film 704 with the ion doping method, with self-arrangement using the gate electrode 706 as a mask. The extent of doping in this case was $1\times10^{14}$–$5\times10^{15}$ atom/cm$^2$, the accelerating voltage was 10–90 kV and, for example, the extent of doping was set to $1\times10^{15}$ atom/cm$^2$ and the accelerating voltage was set to 80 kV. The N-type impurity regions 707 were formed as a result of this procedure. (FIG. 7(C))

Moreover, activation of the doped impurity regions 707 was carried out by irradiation with a KrF excimer laser (wavelength 248 nm, pulse width 20 nsec). The appropriate energy density of the laser was 200–400 mJ/cm$^2$, and preferably 250–300 mJ/cm$^2$. This process could also have been carried out by means of a heat treatment.

Next, a silicon oxide film of thickness 4000 Å was formed by means of plasma CVD for the interlayer insulating film 708. (FIG. 7(D))

Then, the interlayer insulating film 708 and the gate insulating film 705 were etched and source/drain contact holes were formed. Subsequently, an aluminum film was formed by means of the sputtering method, patterning was carried out, the source/drain electrodes 709 were formed and the N-channel-type TFT was completed.

The deterioration of the TFT produced in this illustrative example was evaluated. The TFT manufacturing process was always the same except that the method of preparing the gate insulating film (any of the methods 1–3) and the method of heat treating the gate insulating film of the third invention ($N_2O$ atmosphere+$NH_3$ atmosphere/ultraviolet light irradiation/500° C./3 hours (the abovementioned conditions are denoted by "$N_2O/NH_3$ atmosphere")) or the method of heat treating the gate insulating film of the fourth invention ($NH_3$ atmosphere+$N_2O$ atmosphere/ultraviolet light irradiation/500° C./3 hours (the abovementioned conditions are denoted by "$NH_3/N_2O$ atmosphere"), or $N_2$ atmosphere/ no ultraviolet light irradiation/500° C./6 hours (the abovementioned conditions are denoted by "$N_2$ atmosphere")) were varied as indicated in the table below. The TFT obtained were set to a drain voltage of +14 V, the gate voltage was varied from −17 V to +17 V and the drain current was measured. The measurement was made ten times, the electric field effect mobility $\mu_{10}$ obtained by measurement on the tenth occasion was compared with the electric field effect mobility $\mu_o$ obtained on the initial measurement, and the value $1-(\mu_{10}/\mu_o)$ was defined as the deterioration factor. The results obtained are shown in the table below. (A minus sign for the deterioration factor signifies that the mobility had increased.)

| Sample | Film Forming Method | Heat Treatment | Deteriorating Factor |
| --- | --- | --- | --- |
| A-1 | No.1 (Plasma CVD with TEOS) | $N_2O/NH_3$ atmosphere | 3.2% |
| A-2 | No.1 (plasma CVD with TEOS) | $NH_3/N_2O$ atmosphere | 3.7% |
| A-3 | No.1 (plasma CVD with TEOS) | $N_2$ atmosphere | 48.5% |
| B-1 | No.2 (Sputter method) | $N_2O/NH_3$ atmosphere | −2.7% |
| B-2 | No.2 (Sputter method) | $NH_3/N_2O$ atmosphere | −2.3% |
| B-3 | No.2 (Sputter method) | $N_2$ atmosphere | 11.9% |
| C-1 | No.3 (ECR-CVD method) | $N_2O/NH_3$ atmosphere | 0.7% |
| C-2 | No.3 (ECR-CVD method) | $NH_3/N_2O$ atmosphere | 1.2% |
| C-3 | No.3 (ECR-CVD method) | $N_2$ atmosphere | 20.5% |

With all of the samples it is clear that the deterioration factor was greatly reduced by a process of irradiating with ultraviolet light when carrying out the heat treatment in an $N_2O$ atmosphere and then irradiating with ultraviolet light while carrying out a heat treatment in an $NH_3$ atmosphere, or conversely by a process of irradiating with ultraviolet light when carrying out the heat treatment in an $NH_3$ atmosphere and then irradiating with ultraviolet light while carrying out a heat treatment in an $N_2O$ atmosphere, of this present invention. Furthermore, it was also clear that no reducing effect on the deterioration factor was seen on carrying out a heat treatment and ultraviolet light irradiating treatment in an $N_2$ atmosphere.

Furthermore, it was also clear from similar experiments that there was no improvement in the deterioration factor if ultraviolet light was not irradiated while the heat treatment was being carried out in the $N_2O$ atmosphere or $NH_3$ atmosphere.

The TFT which had been produced in this illustrative example had good durability and little deterioration even though a silicon oxide film which had been prepared using a PVD method or CVD method was being used for the gate insulating film, and TFT which had excellent characteristics was obtained. This is due to the fact that amounts of carbon and hydrogen in the silicon oxide film had been reduced and the nitrogen had been increased by the heat treatment with the conjoint use of ultraviolet light irradiation carried out in an $NH_3$ atmosphere following the carrying out of a heat treatment with the conjoint use of ultraviolet irradiation in an $N_2O$ atmosphere, or by the heat treatment with the conjoint use of ultraviolet light irradiation carried out in an $N_2O$ atmosphere following by the carrying out of a heat treatment with the conjoint use of ultraviolet irradiation in an $NH_3$ atmosphere, in accordance with the present inventions.

EXAMPLE 12

This illustrative example is an example in which silicon oxide films which had been formed on a silicon film by means of the plasma CVD method with TEOS as the raw material are heat treated using the heat treatment apparatus shown in FIG. 2. The silicon oxide films used in this illustrative example were formed using method 1 for the silicon oxide film 705 of Illustrative Example 1 (see FIG. 7(B)).

As shown in FIG. 2, the heat treatment apparatus used in this illustrative example was different from the single plate chamber shown in Example 11, and in this case it was constructed with just a chamber for carrying out the heat treatment and it provided a batch system with which a plurality of plates could be treated at the same time.

The chamber 201 in this illustrative example was cylindrical in shape, and it was such that the substrates 203 could be arranged around the inner wall. Moreover, the substrates could be heated by the heaters 202 which were established around the circumference of the chamber 201. Moreover, the ultraviolet light source 204 was established in the middle of the chamber 201 in such a way that ultraviolet light was irradiated equally onto all of the substrates. A low pressure mercury lamp (center wavelength 246 nm and 185 nm) was used for the ultraviolet light source in this illustrative example.

Furthermore, the exhausting system 206 for carrying out evacuation and the gas supply system 205 for introducing gas were established in the chamber.

The method of treatment using this apparatus will now be described. First of all the substrates 203 were set around the inner wall of the chamber 201 in such a way as to surround the ultraviolet light source 204. Then $N_2$ gas was introduced into the chamber 201 from the gas supply system and the interior of the chamber was displaced with $N_2$. At this time, gas was evacuated via the exhausting system 206 and a constant pressure was generally maintained within the chamber.

Next, after displacing the interior of the chamber with $N_2$, the heaters were heated and ultraviolet irradiation was started. At this time the heating temperature was 300–700° C., and it was set to 500° C. for example.

After heating the substrates to the prescribed temperature, the $N_2$ was replaced with $N_2H_4$ and irradiation with ultraviolet light was carried out. At this time, the duration of the treatment was from 30 minutes to 6 hours, and it was carried out, for example, for 2 hours.

After this, $N_2$ was again introduced into the chamber and the $N_2H_4$ was displaced by $N_2$. Then, the $N_2$ was displaced with $N_2O$ and a second heat treatment was carried out with irradiation with ultraviolet light. At this time, the heating temperature was 500° C. and the heat treatment was carried out for a heating time of 2 hours.

The silicon oxide films obtained on carrying out the abovementioned treatment were analyzed using secondary ion mass spectroscopy (SIMS) and it was observed that the amount of nitrogen had increased above the nitrogen concentration included in the silicon oxide film initially, and that the carbon and hydrogen had fallen, and that there was, in particular, an accumulation of nitrogen at the boundary with the silicon film.

EXAMPLE 13

This illustrative example is an example in which silicon oxide films which had been formed on a silicon film by means of the plasma CVD method with TEOS as the raw material were heat treated using the heat treatment apparatus shown in FIG. 3. The silicon oxide films used in this illustrative example were formed using method 1 for the silicon oxide film 705 (see FIG. 7(B)) of Illustrative Example 1.

As shown in FIG. 3, the heat treatment apparatus used in this illustrative example was constructed from the chamber 301 for carrying out heat treatment, the standby chamber 301 in which the substrates were held before treatment, the standby chamber 303 in which the substrates were held after treatment and the front chambers 304 and 305 which were furnished with the transporting devices 306 and 307, and the substrates 308 and 309 were moved between these chambers by means of the transporting devices 306 and 307. Moreover, in this illustrative example the chamber for carrying out the heat treatment is of the batch type in which heat treatment can be carried out while moving a plurality of substrates at the same time by means of a conveyor.

The internal construction of the chamber 301 is shown in FIGS. 4(A) and 4(B). The conveyor 401 which is made of heat resistant metal is established in the chamber 301 in such a way that the substrates can be heat treated while they are being moved. Furthermore, the heater 406, 407, 408 for heating the substrates 402 is established below the conveyor 401. The heater is constructed with three different zones, namely the part 406 where the temperature of the substrates is raised, the part 407 which is heated to a constant temperature and the cooling part 408. Moreover, the ultraviolet light source 409 is established over the part of the conveyor which is being heated to a constant temperature. A low pressure mercury lamp (center wavelength 246 nm and 185 nm) was used for the ultraviolet light source in this illustrative example.

Furthermore, the exhausting systems 412 and 413 for evacuating gas and the gas supply systems 409, 410 and 411 for supplying gas were established in the chamber 301. In this illustrative example, gas supply systems were established for each part so that an $N_2$ atmosphere was established in the parts 403 and 405 where the substrates were being heated up and cooled down and an $N_2O$ or hydrogen nitride atmosphere was established in the part 404 where the substrates were being heated at a constant temperature and irradiated with ultraviolet light. Moreover, the exhausting systems 412 and 413 were established in the vicinities of the boundaries between these zones for evacuating the gases which had been introduced. Mixing of the gases in each zone was prevented by the establishment of the exhausting systems 412 and 413 in the boundary regions.

The operating process is outlined below. First of all a plurality of untreated substrates was set in a cassette and this was set in the standby chamber 302. In this illustrative example there were two standby chambers for setting the untreated substrates and two standby chambers for setting the treated substrates, and this enabled replacement of the cassettes to be achieved without stopping the apparatus in a-continuous process with a view to increasing the efficiency of the operation. Subsequently, the substrates were moved into the front chamber 304 by the transporting device 306 and, moreover, they were moved into the chamber 301 for heat treatment purposes and established on the conveyor 401. At this time the substrates 402 were arranged in two rows on the conveyor 401.

Then they were moved into the heating process, and the temperature gradient along the conveyor 401 was as shown in FIG. 4(C). First of all, the substrates were heated at a rate of 5–30° C./min, for example at a rate of 10° C./min, in the heating zone 403. At this time $N_2$ was being introduced from the gas supply system 409 and the heating was carried out in an $N_2$ atmosphere.

Subsequently, the substrates were moved into the zone 404 which was being heated to a constant temperature. The heat treatment was carried out here while the substrates were being irradiated with ultraviolet light from the ultraviolet light source which had been established over the conveyor. The heating temperature was 500–600° C., being set, for example, to 550° C. $N_2O$ gas was supplied from the gas supply system 410 at this time and an $N_2O$ atmosphere was provided. Moreover, twenty substrates could be treated at the same time in the zone 404. Furthermore, the time required for one substrate to pass through this zone, which is to say the time required to heat treat one substrate, was from 30 minutes to 6 hours, and it is set, for example, to 3 hours.

After carrying out the heat treatment in this way, the substrate was cooled to 250° C. in the cooling zone 405. The cooling rate at this time was 5–30° C./min, the same as when heating, and it was set, for example, to 10° C./min. Moreover, $N_2$ was being introduced from the gas supply system 411 at this time and an $N_2$ atmosphere was provided.

Subsequently, the treated substrates were moved into the front chamber 305 by means of the transporting device 307 and then they were set in a cassette in the standby chamber 303 in which the substrates were held after treatment, and the first substrate treatment process was completed.

Subsequently, the substrates with which the first substrate treatment process had been completed were set once again in the standby chamber 301 and a heat treatment was carried out. The heating process was carried out in the same way as in the earlier process. Thus, the substrates were heat treated while being irradiated with ultraviolet light from the ultraviolet light source which had been established over the conveyor when they had been moved into the zone 404 which had been heated to a constant temperature. The heating temperature was set at 550° C. At this time $NH_3$ was being introduced from the gas supply system 410 and an $NH_3$ atmosphere was provided.

After carrying out the heat treatment in this way, the substrates were cooled to 250° C. in the cooling zone 405. The cooling rate at this time was 5–30° C./min, the same as when heating, and it was set, for example, to 10° C./min. Moreover, $N_2$ was being introduced from the gas supply system 411 at this time and an $N_2$ atmosphere was provided.

Subsequently, the treated substrates were moved into the front chamber 305 by means of the transporting device 307 and then they were set in a cassette in the standby chamber 303 in which the substrates were held after treatment, and the substrate treatment process was completed.

Heat treatment in an $NH_3$ atmosphere with the conjoint use of ultraviolet light irradiation was carried out after heat treatment in an $N_2O$ atmosphere with the conjoint use of ultraviolet light irradiation had been carried out in this way, and while about 7 hours was required to treat one substrate in the apparatus shown in Example 1, only about 20 minutes was required when the apparatus shown in this illustrative example was used, and the productivity was increased.

The heat treatment of this invention was carried out in the way described above. The results obtained on analysis using secondary ion mass spectroscopy (SIMS) were that the amount of nitrogen in the silicon oxide film, especially at the boundary with the silicon film, was increased as a result of the heat treatment carried out with the conjoint use of ultraviolet light, and it was observed that the carbon and hydrogen concentrations were reduced. This was the same effect as that obtained on heat treating at 900° C. in the same atmospheres.

EXAMPLE 14

This illustrative example is an example in which silicon oxide films which had been formed on a silicon film by means of the plasma CVD method using TEOS as the raw material are heat treated using the heat treatment apparatus shown in FIG. 5. The silicon oxide films used in this illustrative example were formed using method 1 for the silicon oxide film 705 (see FIG. 7(B)) in Illustrative Example 1.

As shown in FIG. 5, the heat treating apparatus used in this illustrative example is constructed with the chamber 501 for carrying out the heat treatment, the standby chamber 502 in which the substrates are held before treatment, the standby chamber 503 in which the substrates are held after treatment and the front chamber 504 which is furnished with the transporting device 505, and the substrates 506 are moved between these chambers by means of the transporting device 505. Moreover, in this illustrative example the chamber 501 is of the batch type and heat treatment can be carried out while moving a plurality of substrates at the same time by means of a conveyor.

The construction of the interior of the chamber 501 is shown in FIGS. 6(A) and 6(B). The conveyor 601 which is made of a heat resistant metal is established in the chamber 501 for mounting the substrates 602. Furthermore, the heater 603 for heating the substrates is established below the conveyor 601. Moreover, the ultraviolet light source 604 is established above the conveyor 601.

Furthermore, the gas supply system 605 is established in the chamber 501 for providing an $N_2$ atmosphere when the substrates are being heated and cooled and an $N_2O$ or hydrogen nitride atmosphere when they are being heated at a constant temperature. Moreover, the exhausting system 606 is established for evacuating the gas which has been introduced. Furthermore, the light source 605 is established for irradiating the substrates with ultraviolet light. A low pressure mercury lamp (center wavelength 246 nm and 185 nm) was used for the ultraviolet light source in this illustrative example.

The treatment operation is described below. The untreated substrates were set in a cassette for a plurality of substrates and this was set in the standby chamber 502. Then, a substrate was moved into the front chamber 504 by means of the transporting device 505 and, moreover, it was moved into the chamber 501 for heat treatment purposes and located on the conveyor 601. The substrates 602 were moved on the conveyor 601 at this time and the process was stopped when a total of twenty substrates had been established in two rows.

The way in which the temperature changed with time during heat treatment is shown in FIG. 6(C). The substrates were heated at a rate of 5–30° C./min, for example at a rate of 10° C./min, during the warming period. $N_2$ gas was being introduced from the gas supply system 605 at this time and the heating was carried out in an $N_2$ atmosphere.

Subsequently, when the temperature at which the heat treatment was to be carried out was reached, ultraviolet light was irradiated from the ultraviolet light source 604 which was established above the conveyor 601. The heating temperature was 500–600° C., and heating was carried out, for example, to 550° C. At this time, $NH_3$ gas was introduced from the gas supply system 605 immediately before the temperature at which the heat treatment was to be carried out had been reached, and when the temperature at which the heat treatment was to be carried out was reached the situation was such that the heat treatment was carried out in a complete $NH_3$ atmosphere. The heat treatment time was from 30 minutes to 6 hours, and it was set, for example, to 3 hours.

Subsequently, the $NH_3$ was displaced with $N_2$, and then the $N_2$ was displaced again with $N_2O$, and a second heat treatment was carried out. The heat treatment time was set to 3 hours.

After carrying out the heat treatment in this way the substrates were cooled to 250° C. The cooling rate at this time was 5–30° C./min, the same as when heating, and it was set, for example, to 10° C./min. Moreover, $N_2$ was introduced from the gas supply system 605 at this time and an $N_2$ atmosphere was provided.

Subsequently, the treated substrates were moved into the front chamber 504 by means of the transporting device 505 and then they were set in a cassette in the standby chamber 503 in which the substrates were held after treatment, and the substrate treatment process was completed.

A heat treatment of this invention was carried out in this way. It was confirmed by means of secondary ion mass spectroscopy (SIMS) that, by means of the treatment described above, a similar amount of nitrogen was contained in the silicon oxide film as that obtained on carrying out a heat treatment at 900° C. in an $N_2O$ atmosphere.

EXAMPLE 15

Figure 8A:
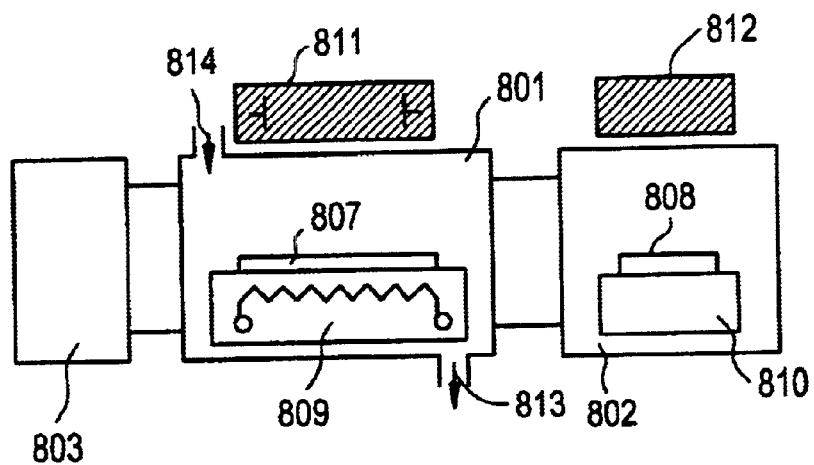
FIG. 8 shows the interior of the chamber of the heat treatment apparatus according to Example 5.
Figure 8B:
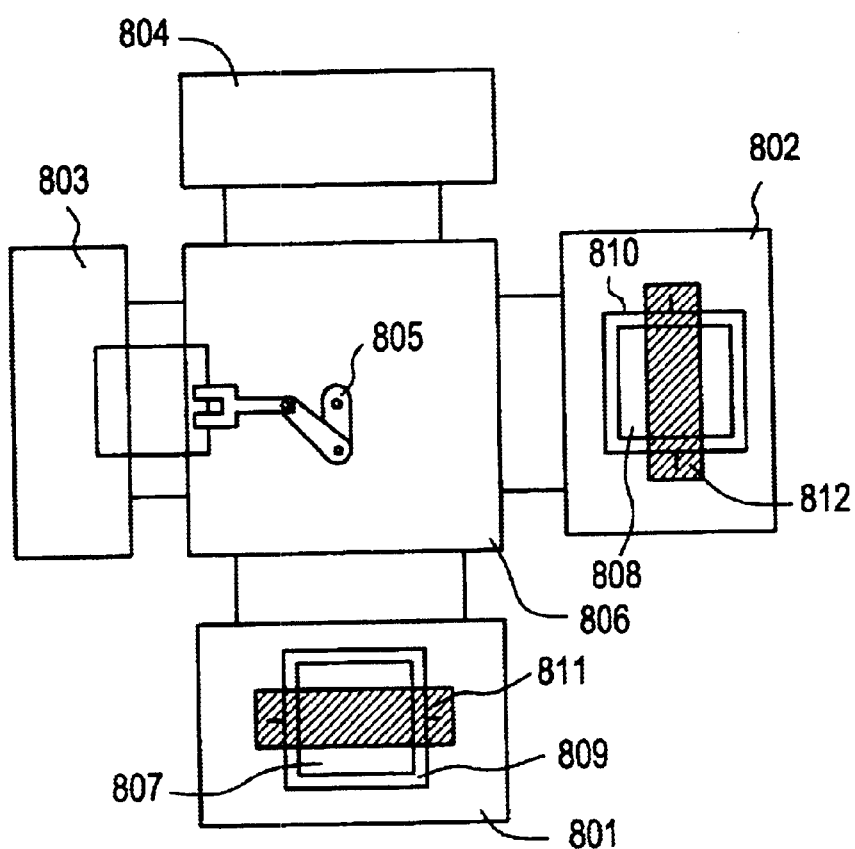
Figure 9B:
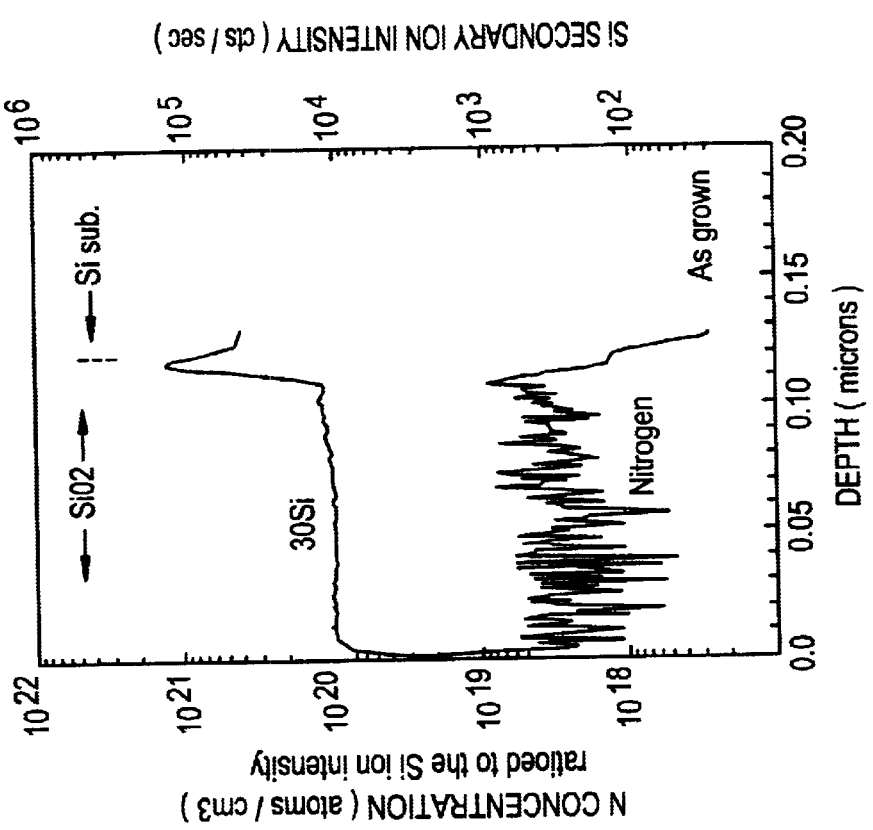
FIG. 9 shows data obtained using SIMS.
Figure 9A:
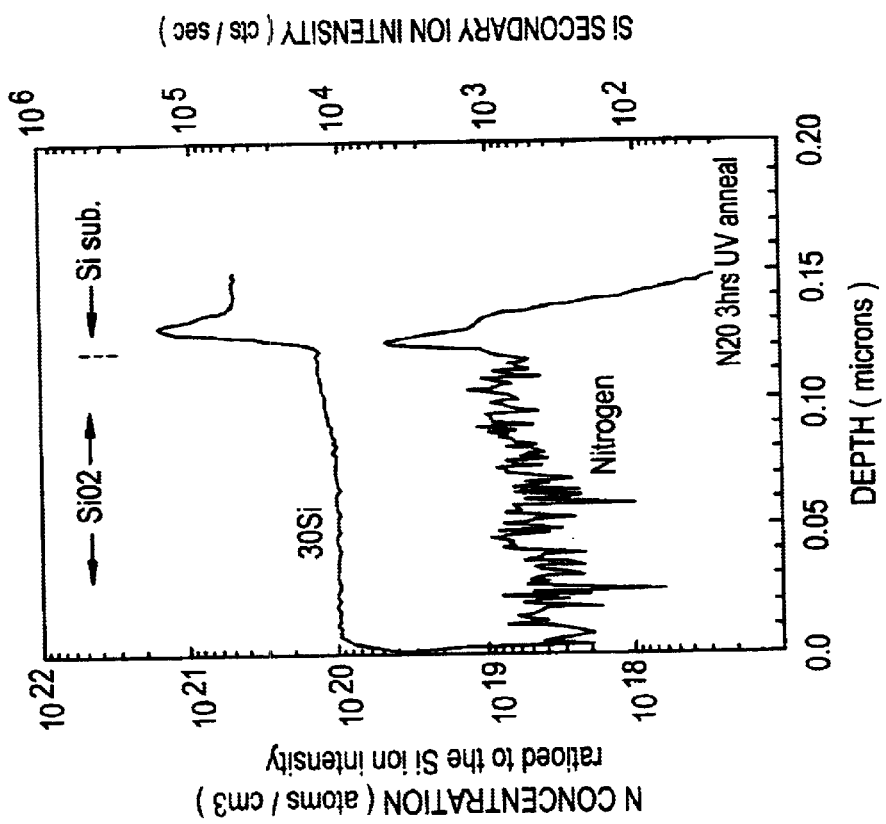

This illustrative example is an example in which silicon oxide films which had been formed on a silicon film by means of the plasma CVD method using TEOS as the raw material are heat treated using the heat treatment apparatus shown in FIG. 8. The silicon oxide films used in this illustrative example were formed using method 1 for the silicon oxide film 705 (see FIG. 7(B)) in Illustrative Example 1.

As shown in FIG. 8, the heat treating apparatus used in this illustrative example had two chambers for carrying out heat treatment, namely the chamber 801 for the exclusive use of an $N_2O$ atmosphere and the chamber 802 for the exclusive use of a hydrogen nitride ($NH_3$ in the case of this illustrative example) atmosphere. Furthermore, it was constructed with the standby chamber 803 in which the substrates were held before treatment, the standby chamber 804 in which the substrates were held after treatment and the front chamber 806 which was furnished with the transporting device 805, and the substrates were moved between these chambers by means of the transporting device 805. Moreover, this illustrative example is a batch-type system in which one substrate is treated at a time in the chamber.

Furthermore, the chambers 801 and 802 had the substrate holders 809 and 810 which had heaters established in the lower parts for heating the substrates 807 and 808. Moreover, the ultraviolet light sources 811 and 812 were established outside the chambers. Low pressure mercury lamps (center wavelength 246 nm and 185 nm) were used for the ultraviolet light sources in this illustrative example. The top parts in the upper parts of the chambers to which the ultraviolet light sources were fitted were formed with a window of a material which did not absorb ultraviolet light, such as quartz for example, so that the ultraviolet light could enter the chambers. Moreover, in this illustrative example the ultraviolet light sources were established outside the chambers, but they could have been established inside the chambers.

Furthermore, the exhausting system 813 for evacuating gas and the gas supply system 814 for introducing gas were established in the chambers and the front chamber.

A heat treatment of the third invention was carried out using this apparatus. First of all a plurality of untreated substrates were set in a cassette and this was set in the standby chamber 803. Then, a substrate was moved into the front chamber by means of the transporting device 805 and then it was moved into the chamber 801 for heat treatment purposes and located on the substrate holder 809.

Then, $N_2O$ was introduced into the chamber from the gas supply system 814 and a heat treatment was carried out while irradiating with ultraviolet light in an essentially 100% $N_2O$ atmosphere with the pressure within the chamber set to atmospheric pressure. The heating temperature at this time was 300–700° C., and it was set, for example, to 500° C. Furthermore, the treatment time was from 30 minutes to 6 hours, and heat treatment was carried out, for example, for 3 hours.

Subsequently, the substrate was moved again into the front chamber 806 by means of the transporting device 805 and moved into the second chamber 802 in which the second heat treatment was to be carried out, and located on the substrate holder 810.

Then, $NH_3$ was introduced into the chamber and a heat treatment was carried out while irradiating with ultra violet light in an essentially 100% $NH_3$ atmosphere with the pressure within the chamber set to atmospheric pressure. The heating temperature at this time was set to 500° C. Furthermore, the heat treatment was carried out for a treatment time of 3 hours.

After carrying out the second heat treatment in this way, the treated substrate was moved into the front chamber 806 by means of the transporting device 805 and then it was set in the cassette in the standby chamber 804 in which the substrates were held after treatment, and the treatment process for one substrate was completed. The same process was repeated subsequently.

The heat treatment of this present invention was carried out in the way described above. It was confirmed by means of secondary ion mass spectroscopy (SIMS) that a similar amount of nitrogen was included in the silicon oxide film as that obtained on carrying out a heat treatment at 900° C. in an $N_2O$ atmosphere.

EXAMPLE 16

This illustrative example is an example in which silicon oxide films which had been formed on a silicon film by means of the low pressure CVD method using monosilane ($SiH_4$) and oxygen gas ($O_2$) as raw materials are heat treated using the heat treatment apparatus shown in FIG. 5. The film-forming conditions for the silicon oxide films used in this illustrative example were substrate temperature 300–500° C. with a pressure inside the chamber of 0.1–10 torr, for example the conditions were set to 400° C. and 1.5 torr.

First of all, a plurality of untreated substrates was set in a cassette and this was set in the standby chamber 502. A substrate was moved into the front chamber 504 by means of the transporting device 505 and, moreover, it was moved into the chamber 501 for heat treatment purposes and located on the conveyor 601.

The way in which the temperature changed with the passage of time during the heat treatment is shown in FIG. 6(C). The substrate was heated at a rate of 5–30° C./min, for example at a rate of 10° C./min, during the warming period. At this time $N_2$ was being introduced from the gas supply system 605 and the heating was carried out in an $N_2$ atmosphere.

Subsequently, when the temperature at which the heat treatment was to be carried out was reached, ultraviolet light (center wavelength 246 nm, 185 nm) was irradiated from the ultraviolet light source 604 which was established over the conveyor 601. The heating temperature was 500–600° C., and the heating was carried out, for example, to 550° C. At this time, $N_2H_4$ gas was introduced from the gas supply system 605 immediately before the temperature at which the heat treatment was to be carried out had been reached, and when the temperature at which the heat treatment was to be carried out was reached the heat treatment was carried out completely in a $N_2H_4$ atmosphere. The heat treatment time was from 30 minutes to 6 hours, and it was set, for example, to 2 hours.

Subsequently, the $N_2H_4$ was displaced with $N_2$, and then the $N_2$ was displaced again with $N_2O$, and a second heat treatment was carried out. The heat treatment time was set to 2 hours.

After carrying out the heat treatment in this way the substrates were cooled to 250° C. The cooling rate at this time was 5–30° C./min, the same as when heating, and it was set, for example, to 10° C./min. Moreover, $N_2$ was introduced from the gas supply system 605 at this time and an $N_2$ atmosphere was provided.

Subsequently, the treated substrate was moved into the front chamber 504 by means of the transporting device 505 and then it was set in a cassette in the standby chamber 503 in which the substrates were held after treatment, and the substrate treatment process was completed.

A heat treatment of this invention was carried out in this way. It was confirmed by means of secondary ion mass spectroscopy (SIMS) that, by means of the treatment described above, a similar amount of nitrogen was contained in the silicon oxide film as that obtained on carrying out a heat treatment at 900° C. in an $N_2O$ atmosphere.

By heat treating silicon oxide films which have been formed by means of a PVD method or CVD method at a low temperature of 300–700° C., and preferably of some 500–600° C., while irradiating with ultraviolet light, in an $N_2O$ atmosphere as in the present invention, it is possible to reduce the carbon and hydrogen concentrations in the silicon oxide film and to increase the nitrogen concentration at the boundary between the silicon oxide and the silicon.

In the illustrative examples the description has centered on silicon oxide films which had been formed by the plasma CVD method using TEOS for the raw material, and this is because a large amount of carbon is included in silicon oxide films which have been formed in this way and the effect of the invention is pronounced. Unpaired bonds and large amounts of hydrogen are also included in silicon oxide films which have been formed using other PVD and CVD methods, such as the sputter method, the ECR-CVD method, the reduced pressure CVD method and the atmospheric pressure CVD method for example, and it seems to be clear that an effect which improves the silicon oxide films which are desirable for gate insulating films is obtained by reducing the concentration of hydrogen and unpaired bonds by the execution of this present invention.

It is possible to increase the nitrogen concentration in a silicon oxide film, and especially at the boundary between the silicon oxide and the silicon, by subjecting a silicon oxide film which has been formed by means of a PVD method or a CVD method to a heat treatment at a low temperature of 300–700° C., and preferably of some 500–600° C., while irradiating with ultraviolet light, in an $NH_3$ or $N_2H_4$ atmosphere as in this present invention.

Silicon oxide films obtained with the plasma CVD method using TEOS for the raw material, the sputter method in a 100% oxygen atmosphere using synthetic quartz for the target and the low pressure CVD method and ECR-CVD method in which monosilane ($SiH_4$) and oxygen were used for the raw material gases have been described in the illustrative examples, but unpaired bonds and large amounts of hydrogen are also included in silicon oxide films which have been formed using other PVD methods and CVD methods, and it seems to be clear that an effect which improves the silicon oxide films and which is desirable for gate insulating films is obtained by reducing the unpaired bonds and increasing the concentration of nitrogen by the execution of this present invention.

In this way, the invention is an industrially beneficial invention in that TFTs which are not liable to deterioration and which have excellent characteristics can be manufactured by using silicon oxide films which have been treated in accordance with the present invention as gate insulating films.

What is claimed is:

1. A method of forming a semiconductor device comprising:
    forming a gate insulating film comprising silicon oxide adjacent to a semiconductor by using a silicon source containing carbon; and
    irradiating an ultraviolet light onto said gate insulating film comprising silicon oxide in an atmosphere comprising $N_2O$ while heating said gate insulating film comprising silicon oxide to a temperature of 600° C. or lower.

2. The method according to claim 1 wherein said semiconductor device comprises a thin film transistor.

3. The method according to claim 1 wherein said temperature is 300° C. or higher.

4. The method according to claim 1 wherein said temperature is 500° C. or higher.

5. The method according to claim 1 wherein said gate insulating film comprising silicon oxide is formed by using oxygen and monosilane as starting materials.

6. The method according to claim 1 wherein the irradiation of said ultraviolet light is carried out in an atmosphere containing a hydrogen nitride gas therein.

7. A method of forming a semiconductor device comprising:
    forming a gate insulating film comprising silicon oxide adjacent to a semiconductor by using TEOS as a starting material; and
    irradiating an ultraviolet light onto said gate insulating film comprising silicon oxide in an atmosphere comprising $N_2O$ while heating said gate insulating film comprising silicon oxide to a temperature of 600° C. or lower.

8. The method according to claim 7 wherein said semiconductor device comprises a thin film transistor.

9. The method according to claim 7 wherein said temperature is 300° C. or higher.

10. The method according to claim 7 wherein said temperature is 500° C. or higher.

11. The method according to claim 7 wherein the irradiation of said ultraviolet light is carried out in an atmosphere containing a hydrogen nitride gas therein.

12. A method of forming a semiconductor device comprising:
    forming an insulating film comprising silicon oxide by using TEOS as a starting material; and
    irradiating an ultraviolet light onto said insulating film comprising silicon oxide in an atmosphere comprising $N_2O$ while heating said insulating film comprising silicon oxide to a temperature of 600° C. or lower.

13. The method according to claim 12 wherein said semiconductor device comprises a thin film transistor.

14. The method according to claim 12 wherein said temperature is 300° C. or higher.

15. The method according to claim 12 wherein said temperature is 500° C. or higher.

16. The method according to claim 12 wherein the irradiation of said ultraviolet light is carried out in an atmosphere containing a hydrogen nitride gas therein.

17. A method of forming a semiconductor device comprising:

forming an insulating film comprising silicon oxide by using a silicon source containing carbon; and irradiating an ultraviolet light onto said insulating film comprising silicon oxide in an atmosphere comprising $N_2O$ while heating said insulating film comprising silicon oxide to a temperature of 300° C. or higher.

18. The method according to claim 17 wherein said semiconductor device comprises a thin film transistor.

19. The method according to claim 17 wherein said temperature is 500° C. or higher.

20. The method according to claim 17 wherein the irradiation of said ultraviolet light is carried out in an atmosphere containing a hydrogen nitride gas therein.

21. A method of forming a semiconductor device comprising:

forming a gate insulating film comprising silicon oxide adjacent to a semiconductor by using TEOS as a starting material; and irradiating an ultraviolet light onto said gate insulating film comprising silicon oxide in an atmosphere comprising $N_2O$ while heating said gate insulating film comprising silicon oxide to a temperature of 300° C. or higher.

22. The method according to claim 21 wherein said semiconductor device comprises a thin film transistor.

23. The method according to claim 21 wherein said temperature is 500° C. or higher.

24. The method according to claim 21 wherein the irradiation of said ultraviolet light is carried out in an atmosphere containing a hydrogen nitride gas therein.

25. A method of forming a semiconductor device comprising:

forming an insulating film comprising silicon oxide adjacent to a semiconductor by using a silicon source containing carbon; and irradiating an ultraviolet light onto said insulating film comprising silicon oxide in an atmosphere comprising $N_2O$ while heating said insulating film comprising silicon oxide to a temperature of 600° C. or lower.

26. The method according to claim 25 wherein said semiconductor device comprises a thin film transistor.

27. The method according to claim 25 wherein said temperature is 300° C. or higher.

28. The method according to claim 25 wherein said temperature is 500° C. or higher.

29. The method according to claim 25 wherein said gate insulating film comprising silicon oxide is formed by using oxygen and monosilane as starting materials.

30. The method according to claim 25 wherein said gate insulating film comprising silicon oxide is formed by using TEOS as a starting material.

* * * * *